US010095217B2

United States Patent
Jacobs, II

(10) Patent No.: US 10,095,217 B2
(45) Date of Patent: *Oct. 9, 2018

(54) NATURAL LANGUAGE USER INTERFACE FOR COMPUTER-AIDED DESIGN SYSTEMS

(71) Applicant: Desprez, LLC, New London, NH (US)

(72) Inventor: James L. Jacobs, II, Amherst, NH (US)

(*) Notice: Subject to any disclaimer, the term of this patent is extended or adjusted under 35 U.S.C. 154(b) by 0 days.

This patent is subject to a terminal disclaimer.

(21) Appl. No.: 15/807,153

(22) Filed: Nov. 8, 2017

(65) Prior Publication Data

US 2018/0067475 A1    Mar. 8, 2018

Related U.S. Application Data

(63) Continuation-in-part of application No. 15/388,940, filed on Dec. 22, 2016, which is a continuation of
(Continued)

(51) Int. Cl.
*G10L 15/00* (2013.01)
*G06F 3/06* (2006.01)
(Continued)

(52) U.S. Cl.
CPC ......... *G05B 19/4093* (2013.01); *G06F 17/50* (2013.01); *G10L 15/00* (2013.01)

(58) Field of Classification Search
CPC ......... G10L 15/00; G10L 15/22; G10L 15/26; G10L 15/265; G05B 19/4093;
(Continued)

(56) References Cited

U.S. PATENT DOCUMENTS

| 4,495,559 A | 1/1985 | Gelatt, Jr. et al. |
| 5,117,354 A | 5/1992 | Long |

(Continued)

FOREIGN PATENT DOCUMENTS

| CN | 2112190 U | 8/1992 |
| WO | 154476 A2 | 8/2001 |

(Continued)

OTHER PUBLICATIONS

Kou, X. Y., S. K. Xue, and S. T. Tan. "Knowledge-guided inference for voice-enabled CAD." Computer-Aided Design 42.6 (2010): 545-557.*

(Continued)

*Primary Examiner* — Paras D Shah
(74) *Attorney, Agent, or Firm* — Micah T. Drayton; Keegan M. Caldwell

(57) ABSTRACT

A method of providing a natural language interface for a CAD system includes receiving a user selection through a GUI of a particular location of a CAD model, receiving a user voice input including a plurality of words and referring to the particular location, parsing the user voice input, determining a meaning for the parsed user voice input that includes a reference to the particular location, one or more words associated with one or more program actions, and one or more words associated with one or more command topics, each related to a specific feature of the CAD model, identifying one or more attributes of the specific feature based on the meaning, identifying from several candidate components at least a component compatible with the specific feature using the one or more attributes and the attribute information of the candidate components, and displaying an indication of the at least a component.

18 Claims, 17 Drawing Sheets

Related U.S. Application Data application No. 14/486,550, filed on Sep. 15, 2014, now Pat. No. 9,613,020.

(51) Int. Cl.
  *G05B 19/00* (2006.01)
  *G05B 19/4093* (2006.01)
  *G06F 17/50* (2006.01)

(58) Field of Classification Search
  CPC ......... G05B 19/4099; G05B 19/40931; G05B 19/40932; G05B 19/40933; G05B 19/40935; G05B 19/40936; G05B 19/40938; G05B 19/4097; G05B 2219/13139; G05B 2219/23005; G05B 2219/23007; G05B 2219/230011; G05B 2219/23012
  USPC ................ 704/275; 700/182, 98; 715/965
  See application file for complete search history.

(56) References Cited

U.S. PATENT DOCUMENTS

| | | |
|---|---|---|
| 5,465,221 A | 11/1995 | Merat et al. |
| 5,495,430 A | 2/1996 | Matsunari et al. |
| 5,552,995 A | 9/1996 | Sebastian |
| 5,570,291 A | 10/1996 | Dudle et al. |
| 5,655,087 A | 8/1997 | Hino et al. |
| 5,758,328 A | 5/1998 | Giovannoli |
| 5,847,971 A | 12/1998 | Ladner et al. |
| 5,870,719 A | 2/1999 | Maritzen et al. |
| 5,937,189 A | 8/1999 | Branson et al. |
| 6,031,535 A | 2/2000 | Barton |
| 6,112,133 A | 8/2000 | Fishman |
| 6,295,513 B1 | 9/2001 | Thackston |
| 6,341,271 B1 | 1/2002 | Salvo et al. |
| 6,343,285 B1 | 1/2002 | Tanaka et al. |
| 6,542,937 B1 | 4/2003 | Kask et al. |
| 6,611,725 B1 * | 8/2003 | Harrison ............ G06T 19/00 345/420 |
| 6,647,373 B1 | 11/2003 | Calton-Foss |
| 6,701,200 B1 | 3/2004 | Lukis et al. |
| 6,750,864 B1 | 6/2004 | Anwar |
| 6,834,312 B2 | 12/2004 | Edwards et al. |
| 6,836,699 B2 | 12/2004 | Lukis et al. |
| 6,859,768 B1 | 2/2005 | Wakelam et al. |
| 6,922,701 B1 | 6/2005 | Ananian et al. |
| 6,917,847 B2 | 7/2005 | Littlejohn et al. |
| 7,006,084 B1 | 2/2006 | Buss et al. |
| 7,058,465 B2 | 6/2006 | Emori et al. |
| 7,072,729 B2 | 7/2006 | McCall et al. |
| 7,079,990 B2 | 7/2006 | Haller et al. |
| 7,085,687 B2 | 8/2006 | Eckenwiler et al. |
| 7,089,082 B1 | 8/2006 | Lukis et al. |
| 7,123,986 B2 | 10/2006 | Lukis et al. |
| 7,134,096 B2 | 11/2006 | Brathwaite et al. |
| 7,299,101 B2 | 11/2007 | Lukis et al. |
| 7,305,367 B1 | 12/2007 | Hollis et al. |
| 7,327,869 B2 | 2/2008 | Boyer |
| 7,343,212 B1 | 3/2008 | Brearley et al. |
| 7,359,886 B2 | 4/2008 | Sakurai et al. |
| 7,366,643 B2 | 4/2008 | Verdura et al. |
| 7,369,970 B2 | 5/2008 | Shimizu et al. |
| 7,418,307 B2 | 8/2008 | Katircioglu |
| 7,467,074 B2 | 12/2008 | Faruque et al. |
| 7,496,487 B2 | 2/2009 | Wakelam et al. |
| 7,496,528 B2 | 2/2009 | Lukis et al. |
| 7,499,871 B1 | 3/2009 | McBrayer et al. |
| 7,523,411 B2 | 4/2009 | Carlin |
| 7,526,358 B2 | 4/2009 | Kawano et al. |
| 7,529,650 B2 | 5/2009 | Wakelam et al. |
| 7,565,139 B2 | 7/2009 | Neven, Sr. et al. |
| 7,565,223 B2 | 7/2009 | Moldenhauer et al. |
| 7,567,849 B1 | 7/2009 | Trammell et al. |
| 7,568,155 B1 | 7/2009 | Axe et al. |
| 7,571,166 B1 | 8/2009 | Davies et al. |
| 7,574,339 B2 | 8/2009 | Lukis et al. |
| 7,590,466 B2 | 9/2009 | Lukis et al. |
| 7,590,565 B2 | 9/2009 | Ward et al. |
| 7,603,191 B2 | 10/2009 | Gross |
| 7,606,628 B2 | 10/2009 | Azuma |
| 7,630,783 B2 | 12/2009 | Walls-Manning et al. |
| 7,656,402 B2 | 2/2010 | Abraham et al. |
| 7,689,936 B2 | 3/2010 | Rosel |
| 7,733,339 B2 | 6/2010 | Laning et al. |
| 7,747,469 B2 | 6/2010 | Hinman |
| 7,748,622 B2 | 7/2010 | Schon et al. |
| 7,761,319 B2 | 7/2010 | Gil et al. |
| 7,822,682 B2 | 10/2010 | Arnold et al. |
| 7,836,573 B2 | 11/2010 | Lukis et al. |
| 7,840,443 B2 | 11/2010 | Lukis et al. |
| 7,908,200 B2 | 3/2011 | Scott et al. |
| 7,957,830 B2 | 6/2011 | Lukis et al. |
| 7,979,313 B1 | 7/2011 | Baar |
| 7,993,140 B2 | 8/2011 | Sakezles |
| 8,000,987 B2 | 8/2011 | Hickey et al. |
| 8,024,207 B2 | 9/2011 | Ouimet |
| 8,140,401 B2 | 3/2012 | Lukis et al. |
| 8,170,946 B2 | 5/2012 | Blair et al. |
| 8,175,933 B2 | 5/2012 | Cook, Jr. et al. |
| 8,180,396 B2 | 5/2012 | Athsani et al. |
| 8,209,327 B2 | 6/2012 | Danish et al. |
| 8,239,284 B2 | 8/2012 | Lukis et al. |
| 8,249,329 B2 | 8/2012 | Silver |
| 8,271,118 B2 | 9/2012 | Pietsch et al. |
| 8,275,583 B2 | 9/2012 | Devarajan et al. |
| 8,295,971 B2 | 10/2012 | Krantz |
| 8,417,478 B2 | 4/2013 | Gintis et al. |
| 8,441,502 B2 | 5/2013 | Reghetti et al. |
| 8,515,820 B2 | 8/2013 | Lopez et al. |
| 8,554,250 B2 | 10/2013 | Linaker |
| 8,571,298 B2 | 10/2013 | McQueen et al. |
| 8,595,171 B2 | 11/2013 | Qu |
| 8,700,185 B2 | 4/2014 | Yucel et al. |
| 8,706,607 B2 | 4/2014 | Sheth et al. |
| 8,768,651 B2 | 7/2014 | Bhaskaran et al. |
| 8,798,324 B2 | 8/2014 | Conradt |
| 8,806,398 B2 | 8/2014 | Brathwaite et al. |
| 8,830,267 B2 | 9/2014 | Brackney |
| 8,849,636 B2 | 9/2014 | Becker et al. |
| 8,861,005 B2 | 10/2014 | Grosz |
| 8,874,413 B2 | 10/2014 | Mulligan et al. |
| 8,923,650 B2 | 12/2014 | Wexler |
| 8,977,558 B2 | 3/2015 | Nielsen et al. |
| 9,037,692 B2 | 5/2015 | Ferris |
| 9,055,120 B1 | 6/2015 | Firman |
| 9,106,764 B2 | 8/2015 | Chan et al. |
| 2001/0023418 A1 | 9/2001 | Suzuki et al. |
| 2001/0047251 A1 | 11/2001 | Kemp |
| 2002/0065790 A1 | 5/2002 | Oouchi |
| 2002/0087440 A1 | 7/2002 | Blair et al. |
| 2002/0099579 A1 | 7/2002 | Stowell et al. |
| 2002/0107673 A1 | 8/2002 | Haller et al. |
| 2002/0152133 A1 | 10/2002 | King et al. |
| 2003/0018490 A1 | 1/2003 | Magers et al. |
| 2003/0069824 A1 | 4/2003 | Menninger |
| 2003/0078846 A1 | 4/2003 | Burk et al. |
| 2003/0139995 A1 | 7/2003 | Farley |
| 2003/0149500 A1 | 8/2003 | Faruque et al. |
| 2003/0163212 A1 | 8/2003 | Smith et al. |
| 2003/0172008 A1 | 9/2003 | Hage et al. |
| 2003/0212610 A1 | 11/2003 | Duffy et al. |
| 2003/0220911 A1 * | 11/2003 | Tompras ............ G06F 17/50 |
| 2004/0008876 A1 * | 1/2004 | Lure ............ G06F 19/3406 382/128 |
| 2004/0113945 A1 | 6/2004 | Park et al. |
| 2004/0195224 A1 | 10/2004 | Kanodia et al. |
| 2005/0055299 A1 | 3/2005 | Chambers et al. |
| 2005/0125092 A1 | 6/2005 | Lukis et al. |
| 2005/0144033 A1 | 6/2005 | Vreeke et al. |
| 2005/0171790 A1 | 8/2005 | Blackmon |
| 2005/0251478 A1 | 11/2005 | Yanavi |
| 2005/0273401 A1 | 12/2005 | Yeh et al. |

(56) References Cited

U.S. PATENT DOCUMENTS

| | | | |
|---|---|---|---|
| 2006/0085322 | A1 | 4/2006 | Crookshanks |
| 2006/0185275 | A1 | 8/2006 | Yatt |
| 2006/0253214 | A1 | 11/2006 | Gross |
| 2007/0016437 | A1 | 1/2007 | Elmufdi et al. |
| 2007/0067146 | A1 | 3/2007 | Devarajan et al. |
| 2007/0073593 | A1 | 5/2007 | Perry et al. |
| 2007/0112635 | A1 | 5/2007 | Loncaric |
| 2007/0179759 | A1 | 8/2007 | Mangon |
| 2007/0198231 | A1 | 8/2007 | Walch |
| 2008/0120086 | A1 | 5/2008 | Lilley et al. |
| 2008/0183614 | A1 | 7/2008 | Gujral et al. |
| 2008/0269942 | A1 | 10/2008 | Free |
| 2008/0281678 | A1 | 11/2008 | Keuls et al. |
| 2009/0058860 | A1 | 3/2009 | Fong et al. |
| 2009/0208773 | A1 | 8/2009 | DuPont |
| 2009/0299799 | A1 | 12/2009 | Racho et al. |
| 2009/0319388 | A1 | 12/2009 | Yuan et al. |
| 2011/0040542 | A1 | 2/2011 | Sendhoff et al. |
| 2011/0047140 | A1 | 2/2011 | Free |
| 2011/0054655 | A1 | 3/2011 | Krantz |
| 2011/0209081 | A1 | 8/2011 | Chen et al. |
| 2011/0213757 | A1 | 9/2011 | Bhaskaran et al. |
| 2012/0016678 | A1 | 1/2012 | Gruber et al. |
| 2012/0072299 | A1 | 3/2012 | Sampsell |
| 2012/0230548 | A1 | 9/2012 | Calman et al. |
| 2012/0316667 | A1 | 12/2012 | Hartloff |
| 2013/0055126 | A1* | 2/2013 | Jackson ............. G06F 3/04845 715/769 |
| 2013/0097259 | A1 | 4/2013 | Li |
| 2013/0100128 | A1 | 4/2013 | Steedly et al. |
| 2013/0138529 | A1 | 5/2013 | Hou |
| 2013/0143512 | A1* | 6/2013 | Hernandez ............. H04W 4/00 455/404.1 |
| 2013/0144566 | A1 | 6/2013 | De Biswas |
| 2013/0166470 | A1 | 6/2013 | Grala et al. |
| 2013/0218961 | A1 | 8/2013 | Ho |
| 2013/0293580 | A1 | 11/2013 | Spivack |
| 2013/0297320 | A1* | 11/2013 | Buser ..................... B33Y 40/00 704/275 |
| 2013/0297460 | A1 | 11/2013 | Spivack |
| 2013/0311914 | A1* | 11/2013 | Daily ....................... G06F 8/38 715/763 |
| 2013/0325410 | A1 | 12/2013 | Jung et al. |
| 2014/0042136 | A1 | 2/2014 | Daniel et al. |
| 2014/0067333 | A1 | 3/2014 | Rodney et al. |
| 2014/0075342 | A1 | 3/2014 | Corlett |
| 2014/0098094 | A1 | 4/2014 | Neumann et al. |
| 2014/0157579 | A1 | 6/2014 | Chhabra et al. |
| 2014/0207605 | A1 | 7/2014 | Allin et al. |
| 2014/0229316 | A1 | 8/2014 | Brandon |
| 2014/0279177 | A1 | 9/2014 | Stump |
| 2014/0358491 | A1* | 12/2014 | Baardse .................. G06F 17/50 703/1 |
| 2014/0372809 | A1* | 12/2014 | Du ..................... G05B 23/0267 714/46 |
| 2014/0379119 | A1 | 12/2014 | Sciacchitano et al. |
| 2015/0055085 | A1 | 2/2015 | Fonte et al. |
| 2015/0066189 | A1 | 3/2015 | Mulligan et al. |
| 2015/0127480 | A1 | 5/2015 | Herrman et al. |
| 2015/0169286 | A1* | 6/2015 | Ezra ........................ G06F 3/167 715/728 |
| 2015/0234377 | A1 | 8/2015 | Mizikovsky |

FOREIGN PATENT DOCUMENTS

| | | | |
|---|---|---|---|
| WO | 171626 | A2 | 9/2001 |
| WO | 2001077781 | A2 | 10/2001 |
| WO | 2006086332 | A2 | 8/2006 |
| WO | 2007067248 | A2 | 6/2007 |
| WO | 2011139630 | A1 | 11/2011 |
| WO | 2011140646 | | 11/2011 |
| WO | 2013058764 | A1 | 4/2013 |
| WO | 2014152396 | A2 | 9/2014 |

OTHER PUBLICATIONS

Xue, S & Y Kou, X & Tan, sooi thor. (2009). Natural Voice-Enabled CAD: Modeling via Natural Discourse. Computer-Aided Design & Applications. 6. 125-136. 10.3722/cadaps.2009.125-136.*

Defining Lead Time for APS Planning; http://t3.apptrix.com/syteline/Language/en-US/Other/Process/Defining_Lead_Time.htm [online][retrieved Mar. 31, 2017].

"Quartiles." Mathisfun.com. Web. <https://www.mathsisfun.com/data/quartiles.html>. Archive. <https://web.archive.org/web/20170313183511/https://www.mathsisfun.com/data/quartiles.html> [online] [retrieved Mar. 31, 2017].

Wu et al. Interactive 3D Geometric Modelers with 2D UI, 2002, State University of Campinas, www.dca.fee.unicamp.br, Sao Paulo, Brazil; 2002, 8 pages.

"Upload Your Photos, Print a 3D Model with hypr3D." SolidSmack. http://www.solidsmack.com/cad-design-news/hypr3d-photo-video-3d-print/; last accessed on Oct. 13, 2015.

"123D Catch." Autodesk. http://apps.123dapp.com/catch/ [online] [retrieved Mar. 31, 2017].

Rothganger et al. "3D Object Modeling and Recognition from Photographs and Image Sequences." Toward Category-Level Object Recognition. 2006, pp. 105-126, vol. 4170 of the series Lecture Notes in Computer Science. Springer Berlin Heidelberg.

Dealer Information Systems Corporation. "Parts Inventory." http://dis-corp.com/content/agriculture/inventory/parts-inventory. [online] [retrieved Mar. 31, 2017].

eMachineShop. "Emachineshop Features." http://www.emachineshop.com/machine-shop/Features/page518.html. [online] [retrieved Mar. 31, 2017].

Retrieved from:http://www.solidworks.com/sw/products/3d-cad/manufacturing-cost-estimation-quoting.htm p. 1: Automatic Manufacturing Cost Estimation Overview; Solidworks; 2015.

Retrieved from: http://www.gom.com/fileadmin/user_upload/industries/touch_probe_fixtures_EN.pdf; Application Example: Quality Control, Online Calibration and Validation of Fixtures, Jigs and Gauges. GOM mbH, 2008.

http://citeseerx.ist.psu.edu/viewdoc/download?doi=10.1.1.194.7785&rep=rep1&type=pdf Kim, Jin Baek, and Arie Segev. "A web services-enabled marketplace architecture for negotiation process management." Decision Support Systems 40.1 (2005): 71-87.

Jaiswal, Ashutosh et al., "Design and Implementation of a Secure Multi-Agent Marketplace", Elsevier Science, pp. 1-23, Jun. 3, 2004; http://magnet.cs.umn.edu/papers/Jaiswal04cera.pdf.

http://www.computer.org/csdl/proceedings/hicss/2005/2268/01/22680038.pdf Bui, Tung, and Alexandre Gachet. "Web services for negotiation and bargaining in electronic markets: Design requirements and implementation framework." System Sciences, 2005. HICSS'05. Proceedings of the 38th Annual Hawaii International Conference on. IEEE, 2005.

http://www.bridgelinedigital.com/File%20Library/Repository/eCommerce/Sample-eCommerce-RFP-Template_Bridgeline-Digital.pdf. Sample RFP Template: Ecommerce Platform, Bridgeline Digital, 2014.

Matchbook, Tealbook, http://www.matchbookinc.com/ Sep. 28, 2015.
3Diligent, Source Smarter, http://www.3diligent.com/customer.html; Sep. 28, 2015.

Dassault Systemes, Brochure, Mar. 24, 2010: New Features Type3ToCatia http://www.type3.us/content/download/2202/405535/file/New%20Feature_Type3ToCatia_2010_US%20old.pdf.

Xue, S., X. Y. Kou, and S. T. Tan. "Natural voice-enabled CAD: modeling via natural discourse." Computer-Aided Design and Applications 6.1 (2009): 125-136.

Sharma, Anirudh, et al. "MozArt: a multimodal interface for conceptual 3D modeling." Proceedings of the 13th international conference on multimodal interfaces. ACM, 2011.

Sorpas ("User Manual,", Swanted Software and Engineering Aps, 2011 (120 pages)).

Kalpakjian, S. and Schmid, S., *Manufacturing Processes for Engineering Materials*, 5$^{th}$ Ed. Pearson (Jul. 27, 2007).

Wang and Bourne, *Design and Manufacturing of Sheet Metal Parts: Using Features to Aid Process Planning and Resolve Manufactur-*

(56) References Cited

OTHER PUBLICATIONS

*ability Problems*, Robotics and Computer-Integrated Manufacturing, vol. 13, No. 3, pp. 281-294 (1997).
U.S. Appl. No. 14/267,447, Aug. 5, 2015, Office Action.
U.S. Appl. No. 14/197,922, Nov. 26, 2014, Office Action.
U.S. Appl. No. 14/197,922, Apr. 27, 2015, Response to Office Action.
U.S. Appl. No. 14/197,922, May 15, 2015, Office Action.
U.S. Appl. No. 14/267,447, Jun. 18, 2015, Response to Office Action.
U.S. Appl. No. 14/263,665, Oct. 8, 2015, Office Action.
U.S. Appl. No. 14/053,222, Jan. 29, 2016, Office Action, now U.S. Pat. No. 9,606,701.
U.S. Appl. No. 14/311,943, Apr. 27, 2016, Office Action.
U.S. Appl. No. 14/486,550, May 26, 2016, Office Action.
U.S. Appl. No. 14/060,033, Jun. 15, 2016, Office Action.
U.S. Appl. No. 14/172,462, Jul. 6, 2016, Office Action.
U.S. Appl. No. 14/053,222, Jul. 29, 2016, Response to Office Action.
U.S. Appl. No. 14/185,204, Jul. 29, 2016, Office Action.
U.S. Appl. No. 14/062,947, Sep. 16, 2016, Office Action.
U.S. Appl. No. 14/457,758, Sep. 30, 2016, Office Action.
U.S. Appl. No. 14/457,758, Mar. 29, 2017, Response to Office Action.
U.S. Appl. No. 14/195,391, Oct. 18, 2017, Office Action.
U.S. Appl. No. 14/172,404, Oct. 20, 2017, Office Action.
U.S. Appl. No. 14/275,116, Dec. 28, 2016, Office Action.
U.S. Appl. No. 14/303,372, Jan. 11, 2017, Office Action.
U.S. Appl. No. 14/246,254, Jan. 11, 2017, Office Action.
U.S. Appl. No. 14/229,008, Jan. 13, 2017, Office Action.
U.S. Appl. No. 14/303,372, filed Jun. 12, 2014.
U.S. Appl. No. 14/185,204, filed Feb. 20, 2014.
U.S. Appl. No. 14/246,254, filed Apr. 7, 2014.
U.S. Appl. No. 15/388,940, filed Dec. 22, 2016.
U.S. Appl. No. 15/728,275, filed Oct. 9, 2017.
U.S. Appl. No. 15/787,423, filed Oct. 18, 2017.
U.S. Appl. No. 15/861,490, filed Jan. 3, 2018.
U.S. Appl. No. 14/486,550, filed Sep. 15, 2014, U.S. Pat. No. 9,613,020.

\* cited by examiner

CAD Context Database 500

| Command Topic | Required Information | | | | | | | Search Address | | | |
|---|---|---|---|---|---|---|---|---|---|---|---|
| | Part Material | Min/Max Thickness | Surface Area | Hole Diameters | Overall Part Dimensions (L x W x H) | Flat Boundary Dimensions | Formula based calc? | McMaster Carr | PEM | Metal Depot | etc... |
| Screw | Yes | Yes | X | Yes | X | X | Yes | X | Yes | X | ... |
| Bolt | Yes | Yes | X | Yes | X | X | Yes | Yes | X | X | ... |
| Nut | Yes | X | X | Yes | X | X | X | Yes | Yes | X | ... |
| Sheet Metal | Yes | Yes | Yes | X | Yes | Yes | X | X | X | Yes | ... |
| Rip | X | Yes | X | X | X | Yes | Yes | X | X | X | ... |
| Bend | Yes | Yes | X | X | X | Yes | Yes | X | X | X | ... |
| Rivet | Yes | Yes | X | Yes | X | X | Yes | X | X | X | ... |
| Seam Weld | Yes | Yes | X | X | X | X | Yes | X | X | X | ... |
| etc... | ... | ... | ... | ... | ... | ... | ... | ... | ... | ... | ... |

FIG. 5

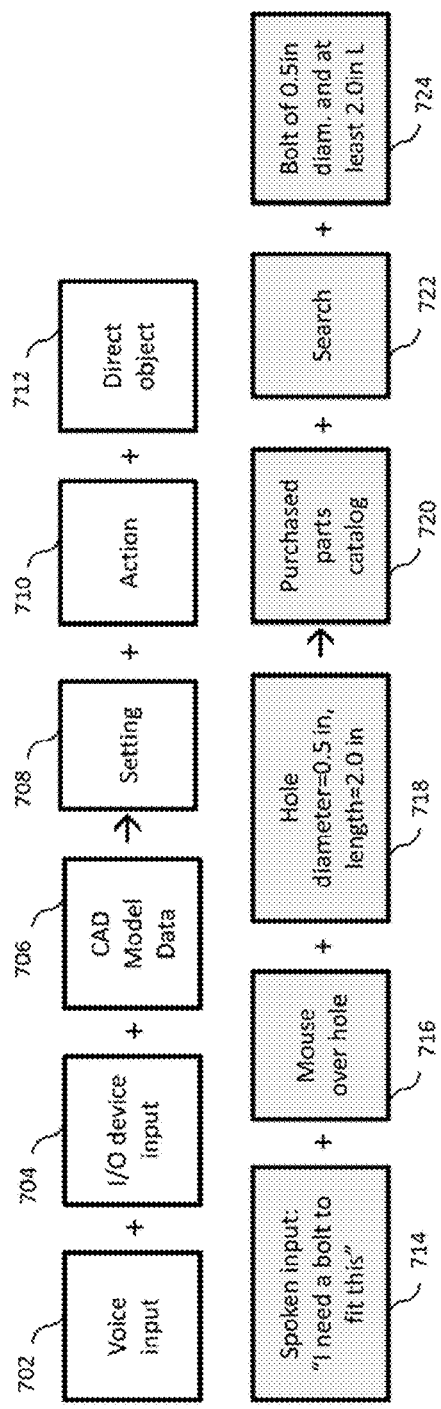
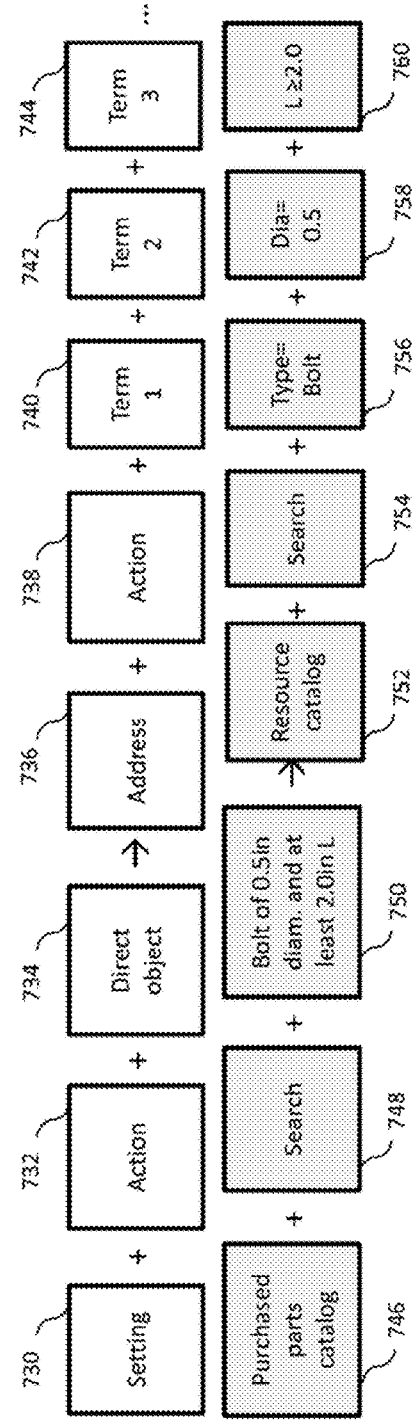
FIG. 7A
FIG. 7B

FIG. 13
Stud library 1300
1304

| Thread Size | Type Fastener Material | | Thread Code | Length Code "L" ±.015 (Length Code in 1/1000s of an inch) | | | | | | | | | | Min. Sheet Thickness (1) | Hole Size in Sheet +.003 -.000 | Max. Hole in Attach. Parts | H ±.015 | S Max. (2) | Min. Dist. Hole ℄ to Edge |
|---|---|---|---|---|---|---|---|---|---|---|---|---|---|---|---|---|---|---|---|
| | Steel | Stainless Steel Aluminum | | 250 | 312 | 375 | 500 | 625 | 750 | 875 | 1.00 | 1.25 | 1.50 | | | | | | |
| .086-56 (#2-56) | FH | FHS | --- | 256 | 4 | 5 | 6 | 8 | 10 | 12 | --- | --- | --- | --- | .040 | .095 | .105 | .144 | .075 | .187 |
| .112-40 (#4-40) | FH | FHS | FHA | 440 | 4 | 5 | 6 | 8 | 10 | 12 | 14 | 16 | 20 | --- | .040 | .111 | .135 | .176 | .085 | .219 |
| .138-32 (#6-32) | FH | FHS | FHA | 632 | 4 | 5 | 6 | 8 | 10 | 12 | 14 | 16 | 20 | 24 | .040 | .137 | .160 | .206 | .090 | .250 |
| .164-32 (#8-32) | FH | FHS | FHA | 832 | 4 | 5 | 6 | 8 | 10 | 12 | 14 | 16 | 20 | 24 | .040 | .163 | .185 | .237 | .090 | .281 |
| .190-24 (#10-24) | FH | FHS | FHA | 024 | --- | 5 | 6 | 8 | 10 | 12 | 14 | 16 | 20 | 24 | .040 | .189 | .210 | .256 | .100 | .281 |
| .190-32 (#10-32) | FH | FHS | FHA | 032 | --- | 5 | 6 | 8 | 10 | 12 | 14 | 16 | 20 | 24 | .040 | .189 | .210 | .256 | .100 | .281 |
| .250-20 (1/4-20) | FH | FHS | FHA | 0420 | --- | --- | 6 | 8 | 10 | 12 | 14 | 16 | 20 | 24 | .062 | .249 | .270 | .337 | .135 | .312 |
| .313-18 (5/16-18) | FH | FHS | --- | 0518 | --- | --- | --- | 8 | 10 | 12 | 14 | 16 | 20 | 24 | .093 | .311 | .333 | .378 | .160 | .375 |

UNIFIED

Aluminum stud listing 1400

NATURAL LANGUAGE USER INTERFACE FOR COMPUTER-AIDED DESIGN SYSTEMS

RELATED APPLICATION DATA

This application is a continuation in part of U.S. patent application Ser. No. 15/388,940, filed on Dec. 22, 2016, which is a continuation of U.S. patent application Ser. No. 14/486,550, filed on Sep. 15, 2014, and entitled "Natural Language User Interfaces for Computer-Aided Design Systems," which is patented with U.S. Pat. No. 9,613,020 B1 issued on Apr. 4, 2017. Each of U.S. patent application Ser. No. 15/388,940, U.S. patent application Ser. No. 14/486,550, and U.S. Pat. No. 9,613,020 B1 is incorporated by reference herein in its entirety.

FIELD OF THE INVENTION

The present invention generally relates to the field of computer-aided design. In particular, the present invention is directed to natural language user interfaces for computer-aided design systems.

BACKGROUND

Computer-aided design (CAD) programs allow designers to create computer models of products to be manufactured. Such programs can be incredibly complex and take extensive training and use before a designer becomes efficient in the use of the program. Natural language interfaces have been proposed as a means for simplifying many different human-machine interactions. While such programs are having increasing success in terms of adoption for general use, for example, the ability to ask simple questions like weather or direction queries of a mobile phone interface (see, e.g., US Pub. No. 2012/0016678, entitled "Intelligent Automated Assistant," which is incorporated by reference herein in its entirety), such systems still do not provide an adequate or user-friendly interface for many complex systems, such as CAD programs, that employ specialized language and wherein context-specific terminology has multiple meanings and/or multiple defining parameters that vary with the context.

While attempts have been made at providing natural language interfaces for CAD systems (see, e.g., US Pub. No. 2009/0058960, entitled "Method For Transforming Language Into A Visual Form," which is incorporated by reference herein in its entirety), such systems in themselves have been overly complex and have not produced results that have led to general application and use.

SUMMARY OF THE DISCLOSURE

In an implementation, the present disclosure is directed to a method of providing a natural language interface for a computer-aided design (CAD) system. The method includes automatedly receiving, via an input device of a computing device, a user selection through a graphical user interface (GUI) of a particular location of a displayed CAD model. The method includes automatedly receiving, via the computing device, a user voice input comprising a plurality of words and referring to the particular location. The method includes automatedly, via the computing device, parsing the user voice input. The method includes automatedly, via the computing device, determining a meaning for the parsed user voice input, the meaning including a reference to the particular location, one or more words associated with one or more program actions, and one or more words associated with one or more command topics, each of the particular location, program actions, and command topics related to a specific feature of the displayed CAD model referred to in the voice input. The method includes automatedly, via the computing device and based on the determined meaning, identifying information including one or more attributes of the specific feature. The method includes automatedly, via the computing device, from among a plurality of candidate components, identifying at least a component compatible with the specific feature as a function of the one or more attributes of the specific feature and attribute information of the plurality of candidate components. The method includes automatedly, via the computing device, displaying an indication of the at least a component compatible with the feature of the structure.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 5 schematically represents a partial example of information contained within a context database according to an embodiment of the present invention;

FIGS. 7A and 7B are block diagrams schematically illustrating another exemplary embodiment of query generating algorithm, wherein FIG. 7A represents an exemplary parsing algorithm and FIG. 7B represents an exemplary query algorithm;

FIG. 13 is a depiction of an exemplary component library of self-clinching studs that may be stored in a compatible components system;

DETAILED DESCRIPTION

Figure 1A:
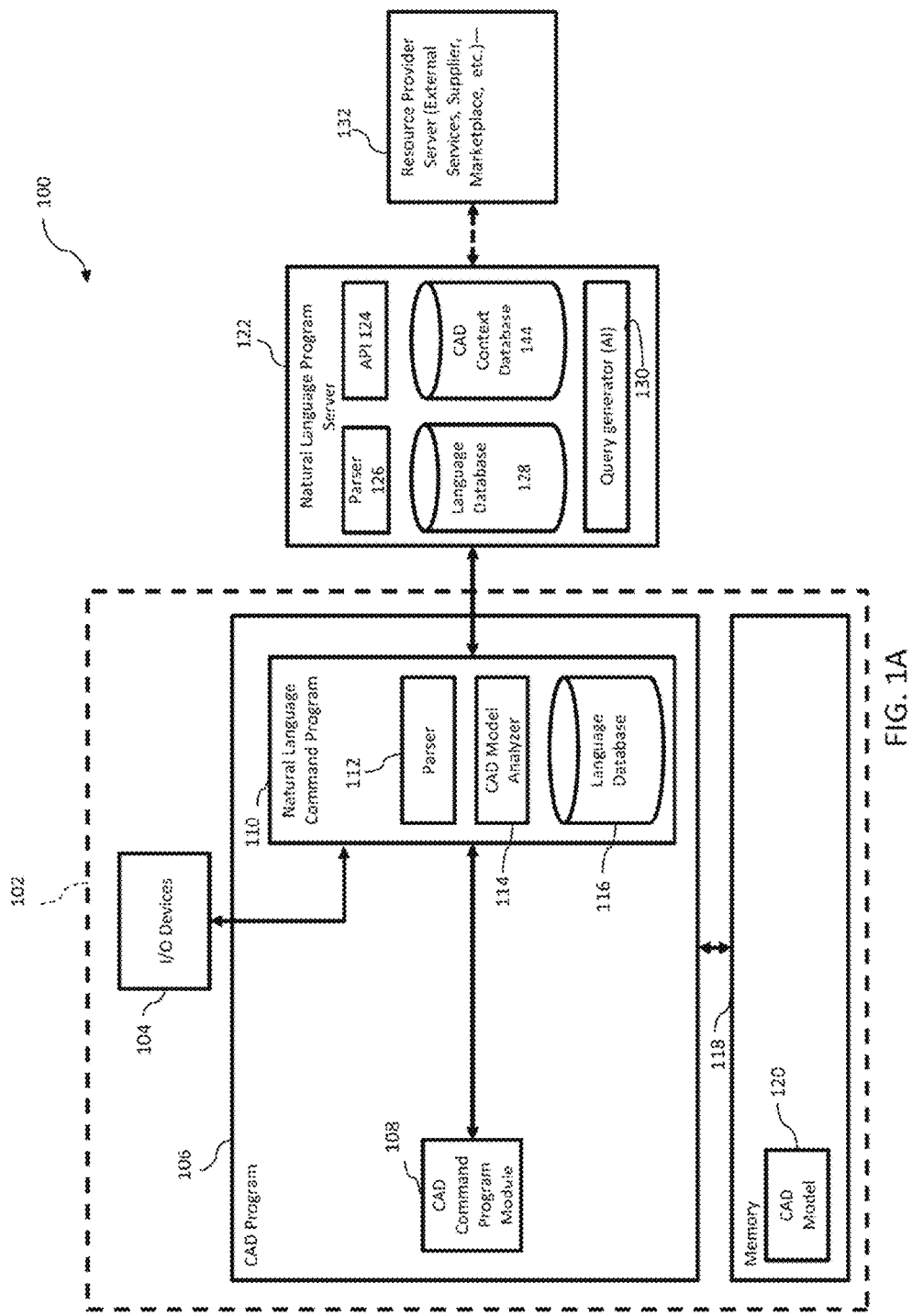
FIG. 1A is a block diagram schematically illustrating a system according to one embodiment of the present invention.

Aspects of the present invention include techniques, methods, hardware and software for providing natural language interfaces in and for computer-aided design (CAD) systems. Exemplary embodiments are described herein below and illustrated in the accompanying drawings. It will be understood by those skilled in the art that various changes, omissions and additions may be made to that which is specifically disclosed herein without departing from the spirit and scope of the present invention.

As used herein, a structure may be an object or part having a particular geometry, and a computer model may be a virtual representation of a structure and may be created using an appropriate CAD system or program. A designer may be the designer of a computer model, a purchaser, an agent of the purchaser, and a consumer, a home user, or a customer, among others. Examples of a structure include a piece of sheet metal, a solid cube, a cylindrical pipe, an injection molded plastic toy, an article of clothing such as a shirt made of cotton, and an assembly of various parts such as a vehicle, among others. A project (or design) may refer to a CAD model of a part or an assembly of CAD models of parts that may be a virtual representation of a particular structure and may be created using one or more appropriate CAD systems or programs.

One or more aspects of the present invention can be implemented in any of a wide variety of manners, such as within a single computing device or by two or more networked computing devices, among others. In some embodiments, functionalities of systems described herein may be integrated into computer modeling programs directly via add-on software.

As would be apparent to one reasonably skilled in the art, aspects and embodiments of the invention may be applied to any number of manufacturing types, including but not limited to the manufacture of apparel and sheet metal products among others. In the case of sheet metal and apparel, designers use CAD systems to design their products, using sheets of flat material for manufacture. Design data, such as material choice, precise dimensions, or locations of additional features may be embedded within the digital design. Designers may choose different metals or fabrics (including non-woven materials such as leather) depending on the strength and other inherent properties of the material, which affects what manufacturing methods may be necessary to work the material. Purchased components (in some cases, identical purchased components) may be added to the design. CAD programs may be used to visualize the shape of the finished product. In both sheet metal and apparel manufacturing the sheet (metal or fabric) may be cut or stamped by a variety of methods using computerized machines. Units are moved from station to station during manufacture. Where sheet metal is connected by rivets or welding, sheet fabric is connected by stitching or gluing. Surface finishes may be applied to both; both may be painted, silk-screened, or otherwise covered with a protective substance. While sheet metal and fabric apparel products have commonalities as discussed above, it will be appreciated by those skilled in the art that other design and manufacturing types which may or may not share many of the same attributes are also amenable to application of embodiments of the present invention.

Referring first to FIG. 1A, an exemplary embodiment of a system 100 in accordance with the teaching of the present invention is described. In one implementation, system 100 comprises one or more computing devices with appropriately networked and/or communicating modules. For example, sub-system 102 may comprise a computer, other computing device or other system as may be devised by a person of ordinary skill for executing functionalities as described herein based on appropriately coded instructions. I/O devices 104 include language-based I/O devices such as a microphone and speakers, as well as other I/O devices such as mouse, keyboard, touch pad or touch screen. CAD program 106 and memory 118 are also included in sub-system 102. CAD program 106 includes, in addition to conventional CAD system functionality, natural language command program 110. Natural language command program 110 comprises parser 112, CAD model analyzer 114 and language database 116. CAD model 120 typically resides in a memory device, such as memory 118 although the memory need not be configured as a part of the system per se, but may be functionally remote and communicate with the system through an appropriate network.

CAD model analyzer 114 functions as a form of interrogator that interrogates the CAD model 120 to return CAD model data as called for by various program functions. In some embodiments, other system modules may include and/or maintain such an interrogator for interrogating information from a CAD model. Additionally or alternatively, natural language program sever module 122, and/or resource provider server module 132 may contain such an interrogator, for example, as a portion of or add-on to a CAD program. CAD model analyzer 114 may analyze a CAD model and output data that may be received and used by natural language command program module 110 or other system modules. Illustrative embodiments for such an analyzer/interrogator may be found in U.S. patent application Ser. No. 14/060,033, filed on Oct. 22, 2013, and titled "AUTOMATED FABRICATION PRICE QUOTING AND FABRICATION ORDERING FOR COMPUTER-MODELED STRUCTURES", which is incorporated by reference herein for its teachings of extracting data from computer models, U.S. patent application Ser. No. 14/282,773, filed on May 20, 2014, and titled "METHODS AND SOFTWARE FOR ENABLING CUSTOM PRICING IN AN ELECTRONIC COMMERCE SYSTEM", which is incorporated by reference herein for its teachings of particular interrogator engines, U.S. patent application Ser. No. 15/467,079, filed on Mar. 23, 2017, and entitled "ELECTRONIC PRICING MACHINE CONFIGURED TO GENERATE PRICES BASED ON SUPPLIER WILLINGNESS AND A USER INTERFACE THEREFOR," which is incorporated by reference herein for its teachings of particular interrogation engines, extraction of information from interrogation engines, analysis of geometry in design files by interrogation engines, extraction of pricing data from computer models, and for generation of pricing for manufactured materials, U.S. Patent Application Ser. No. 62/072,653, filed on Oct. 30, 2014, and titled "METHODS AND SOFTWARE FOR FACILITATING PRICING AND ORDERING OF A STRUCTURE REPRESENTED IN A COMPUTER MODEL," which is incorporated by reference herein for its teachings of various interrogation engines and related functionality and for generation of pricing for manufactured materials.

CAD program module 106 may comprise any of the modules in a conventional CAD system or program that govern one or more functions of the CAD program as would be understood by persons of ordinary skill in the art. Examples of other CAD system models, not shown, may include: create new item module, select material module, bend module, weld module or cut module.

However, natural language command program module 110 is in addition to the conventional modules of the CAD system or program.

Parser 112 parses content of spoken commands received through I/O devices 104 and communicates with language database 116 to determine relevant portions of the spoken command for formulating a query as discussed in more detail below. CAD model analyzer 114, like interrogator, searches for specific information in CAD model 120 and communicates with natural language server module 122.

Natural language program server module, which may be remotely located, may comprise a high capacity server/database to assist in parsing any natural language commands that cannot be parsed through resident module 110. Thus, natural language program server module 122 includes parser 126, which is similar in function to parser 112 but more powerful, and API 124, which would be used to translate commands into required syntax for other system modules, for example, to communicate with resource provider server module 132. Language database 128 is a larger, more powerful version of database 116, and may comprise multiple specialized, plurally accessible library-type databases. Query generator 130 may comprise the artificial intelligence for query generation as described herein below (see, for example, FIGS. 6, 7A and 7B) and thus may comprise a processor and memory of its own, as well as other associated hardware and software suited for its query generation function. CAD context database 144 contains CAD specific information as shown in FIG. 5 and described in more detail below.

Resource provider server module 132 provides external services and/or information when called for by module 122. For example, when information needed to respond to a query resides outside of the CAD system and natural language program server module 122, automated searching of appropriate databases is initiated, the databases being supplied as resource provider server modules 132 in order to provide information from suppliers, marketplaces, and other external services. In some examples, resource provider server module 132 is an external service supplier marketplace database, either a source of information or standalone entity that will perform calculations.

In operation a natural language command plus any additional information concomitantly entered is received through I/O devices 104 and directed to natural language command program module 110, which then parses the command, breaking it into pieces and identifying, using language database 116, the meaning of the command. Information that is identified as being contained within CAD model 120 is analyzed and retrieved by CAD model analyzer 114 by interrogating the CAD model. If for some reason natural language command program module 110 is unable to determine the meaning of a command, it will send an audio file to natural language program server module 122 to be further parsed by parser 126, accessing language database(s) 128. Also at this point, CAD context database 144 communicates with parser 126 to determine what information must be pulled from CAD model 120. Pulled information is sent back through CAD model analyzer 114 to server module 122 and query generator 130 generates a query based on retrieved information.

CAD context database 144 supplements language databases 116 and 128 with CAD specific contextual information that is accessed, for example, when parser 126 is unable to parse a command by access to the more general language databases or if more than one contextual meaning is identified. For example, CAD context database 144 contains information necessary to identify a bolt as a purchase part that is associated with a nut, to separate it from other general language context meanings (i.e., to leave quickly or a lightning bolt). CAD context database 144 also contains information to direct natural language server program module 122 to query resource provider modules 132 when supplier-type or other externally provided information is needed for query completion.

If the query can be executed by the CAD program without further information or data inputs, then the command is translated to the CAD program through natural language command program module 110. However, when the query requires additional, non-resident information, the query is then translated by API 124 and sent to resource provider server module 132 for answer. When the response is returned from resource provider server module 132, API 124 translates the response into a format that can be used by the CAD program module and it is sent back through natural language command program module 110, which delivers an output, such as an auditory output, through I/O devices 104 and/or instructs the CAD command program module 108 to execute the command.

Figure 1B:
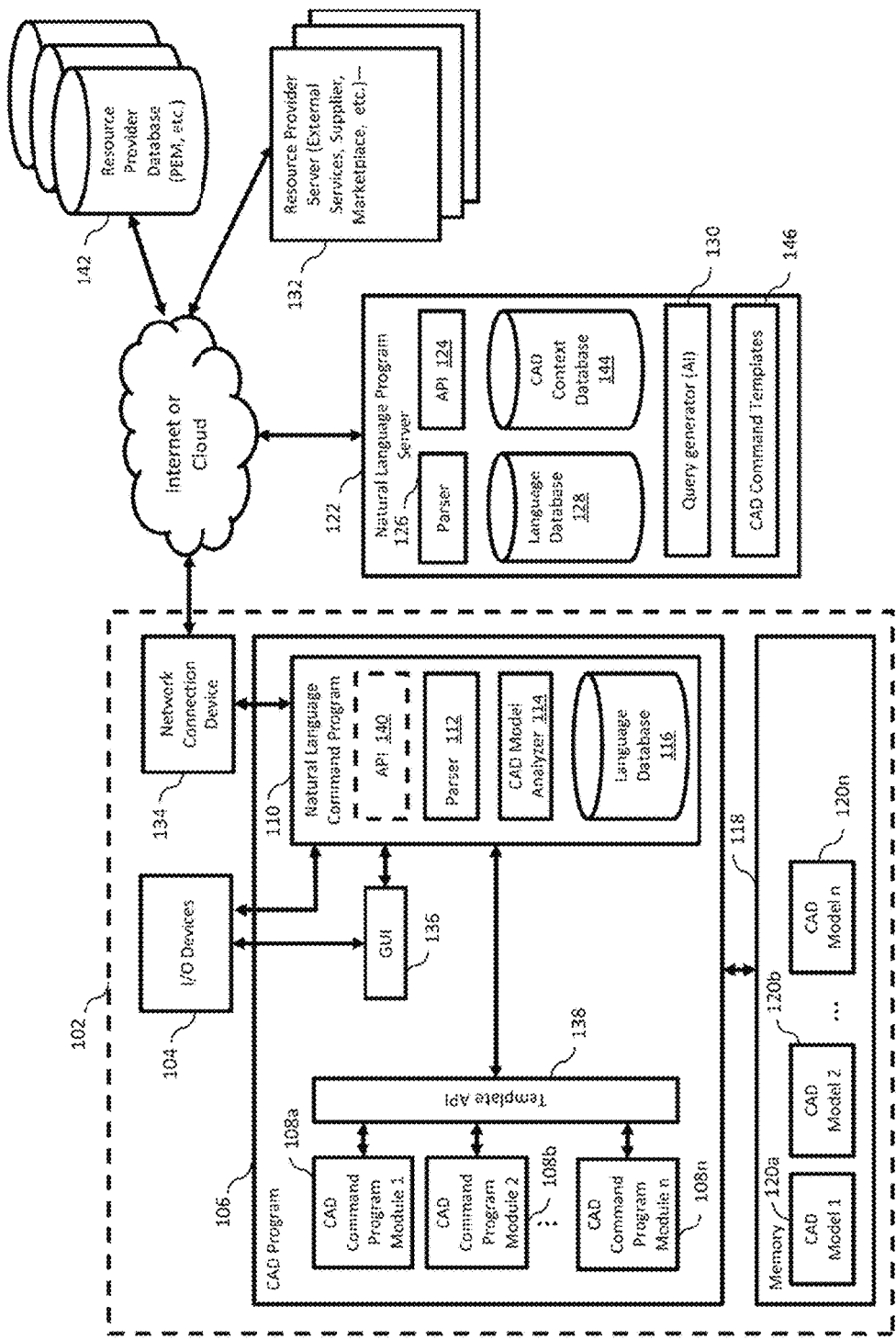
FIG. 1B is a block diagram schematically illustrating an alternative system according to another embodiment of the present invention.

With reference to FIG. 1B, a further alternative system is described. As will be seen, the basic components of FIG. 1A are carried over to the embodiment of FIG. 1B. Added components include network connection device 134 that permits communication with an network, the Internet or information stored in a cloud. Communication through this path may be with natural language program server module 122 as previously described, as well as multiple resource provider server modules 132 and direction with resource provider databases 142.

In this embodiment, CAD program 106 also includes plural CAD program modules 108a, b . . . n communicating with natural language command program module 110 through template API 138. Template API 138 is used to translate commands and other information coming back from the natural language command program module 110 into a command that can be used by the particular CAD program. GUI 136 is also added, optionally communicating between I/O devices 104 and natural language command program module 110 to facilitate interaction with the user. Optional API 140 inside natural language command program module 110 translates and facilitates communications between the various sub-modules.

Within natural language program server module 122, CAD command templates 146 are used in conjunction with template API 138 to send instructions in the language that the CAD program will understand. Thus, CAD model 120a, b, . . . n is to be changed using a command program module. Template API 138 translates a command in a template form to a command that is actually understood by the module.

The following prophetic examples further illustrate operation of embodiments of the system thus described. As is typical in natural language interfaces, the "system" is assigned a name to be spoken by the user to initiation language recognition and parsing, and to distinguish commands from other spoken words. Any suitable name may be assigned. In this case, for illustration purposes only, the assigned name is "Nalcop," representing natural language command program module 110.

EXAMPLE 1

In operation, a user clicks a hole and says, "Nalcop, I need bolts to fit this hole." Nalcop parses the command with parser 112 and determines that "this hole" refers to a highlighted feature in the displayed CAD model. Natural language command program module 110 then uses CAD model analyzer 114 to gather all data related to the hole from CAD model 120. Then, it sends the data plus message to natural language command program server module 122, where the natural language statement and CAD model data is further parsed (if necessary). Query generator 130 creates a search command using the parsed statement and the CAD model data, and searches resource provider server modules 132 or databases 142 for bolts of the correct diameter and correct length that are compatible with the material in which the hole is located. That data is returned to natural language command program module 110, which displays it in GUI 136.

EXAMPLE 2

In operation, a user says, "Nalcop, this shelf needs to hold 40 pounds." Natural language command program module 110 cannot initially parse this command, so it sends a voice record to natural language program server module 122. Server module 122 parses the statement and determines that the user's statement is a request to calculate whether the structure can hold 40 pounds. Based on this determination, made using parser 126, language database 128 and CAD context database 144, server module 122 sends natural language command program module 110 instructions to analyze the entire CAD model (to get material, thickness, and angles) and to ask the user which way is up (e.g. necessary to know directionality to perform the analysis) and what factor of safety the user would like to use (e.g., necessary to know how sure the user wants to be that the shelf will hold 40 pounds). Natural language command program module 110 thus poses the required questions through GUI 136 and/or I/O devices 104 and waits for a response from the user. Required CAD model data is accessed by CAD model analyzer 114, combined with user inputs in response to stated questions and transmitted to server module 122. API 124 puts the information in the correct format and sends the data to a resource provider server module 132 which can perform a stress (statics) analysis on a model of that shape using that material. If the analysis determines that the aluminum brackets supporting the shelf will not support the weight, server module 122 sends a "no" answer to natural language command program module 110, which communicates the answer to the user through GUI 136 and/or I/O devices 104. Such communication may take the form of a statement delivered through system speakers. The user may choose to respond to the "no" answer with a further question, such as "Well Nalcop, what will work?" In such a case, that question is parsed to be a request for design modifications. Server module 122 sends common fabrication material options to resource provider server modules 132 to determine whether using a different material in the bracket will work. For purposes of this example, assume stainless steel would be sufficient to hold the weight. In this case, server module 122 may also send different bracket thicknesses, but using the original material (aluminum), to resource provider server modules 132. Assume it is determined that doubling the thickness in the original material will also work. Server module 122 then sends natural language command program module 110 information that the CAD model as it exists will not hold 40 pounds, but stainless steel or double-thickness aluminum will. Natural language command program module 110 then prompts the user through I/O devices 104 and or GUI 136 to indicate whether he wants to use stainless steel or double the thickness of aluminum. The user selection is sent back to server module 122, which fills out a CAD Command Template 146, which is sent back through natural language command program module 110 to template API 138, which instructs CAD program module(s) 108$a, b \ldots n$ to make the change.

Figures 2, 4:
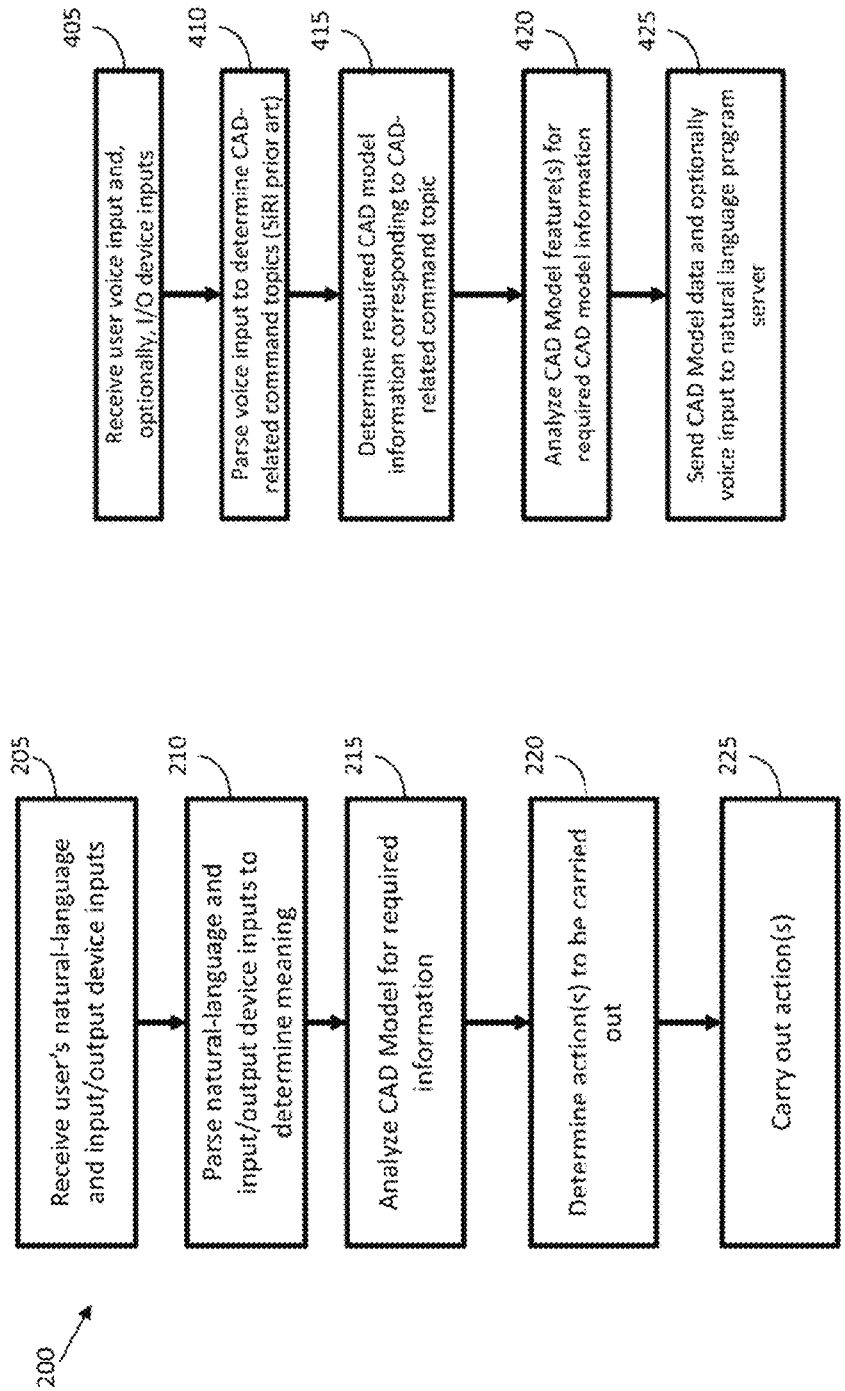
FIG. 2 is a flow diagram illustrating a high level method according to an embodiment of the present invention.
FIG. 4 is a flow diagram illustrating a sub-step within the embodiments shown in FIG. 2 or 3.
Figure 3:
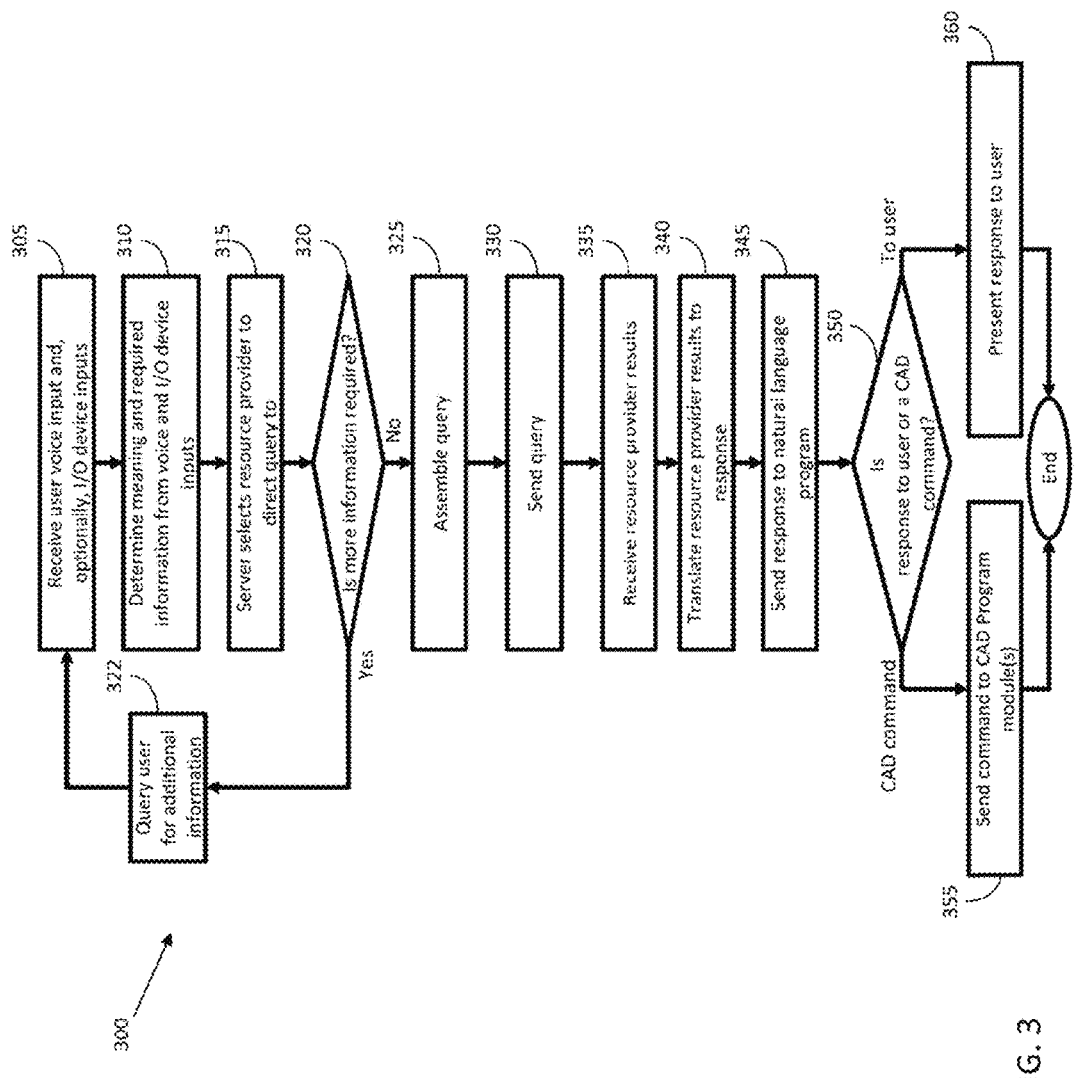
FIG. 3 is a flow diagram illustrating another embodiment of a method according to the present invention with more detail.

Operation of embodiments of the present invention may be further understood with references to the flow diagrams in FIGS. 2, 3 and 4. FIG. 2 illustrates a high level method comprising five general steps. Step 205 comprises receiving user natural language and input/output device inputs, in other words the user speaks and may also use keyboard or mouse to highlight. For example, a user may say "I need a bolt to fit this hole" while using the mouse to identify the hole and natural language command program module 110 will appropriately associate the two different types of inputs based on context and proximity in time. For example, the context of the parse can include recognition of keyboard/mouse commands such as "make this <highlighted with mouse>, aluminum." In a further alternative, distinct commands may be assigned to correspond to the mouse or keyboard commands so that context is not required, for example, predetermining that spoken "this" plus an immediate physical I/O action go together.

Step 210 comprises parsing the natural language inputs to determine meaning and required information. Step 215 comprises analyzing CAD model 120 for required information, typically using CAD model analyzer 114. Step 220 comprises determining actions to be carried out, for example determining results using resource provider server modules or databases as described above. Step 225 comprises carrying out the action or actions or delivering results to the user.

More detailed method steps are described in connection with the embodiment shown in FIG. 3. In this embodiment, a first step 305 comprises receiving a user voice input and optionally input/output device input as described. In step 310 the meaning of voice and I/O device inputs is determined. More detail on this step is provided in the discussion of FIG. 4 below. Next, at step 315, server module 122 selects a resource provider server module 132 to which the query is to be directed.

Step 320 requires a determination of whether more information is required. If YES, step 322 generates a query to the user to provide additional information and program flow returns to step 305 upon information receipt. If NO, program flow continues on to step 325. In step 325 the query is assembled and then sent in step 330. In step 335 resource provider results are received from either or both of the resource provider server module or databases. Step 340 comprises translating the resource provider results to a response in a form useable by the CAD system. In step 345, the translated response is sent to the natural language command program module.

Step 350 requires another determination, in this case whether the returned response is a CAD command or a response to be directed to the user. In other words, is the response something that is intended to seek feedback or find answer from the user, or is it really a CAD command that should be going into the CAD program for execution? If a CAD command, it is routed at 355 for execution by a CAD program module; if a user response, it is routed at 360 to an appropriate I/O device for communication with the user.

Turning now to FIG. 4, more detail of the command meaning determination in step 310 above is provided. The process in this embodiment begins at step 405 with receiving user voice input and optionally I/O device input, in this case the same as step 305. Next, in step 410, the voice input is parsed to determine the meaning as is generally understood by persons skilled in the art of natural language program interfaces. In step 415, required CAD model information corresponding to as determined CAD-related command topics is further determined. In step 420, CAD model features are analyzed (for example, by CAD model analyzer 114) for required CAD model information. Thereafter, in step 425, CAD model data and optionally voice input are sent to the natural language program server module for further action as elsewhere described herein.

FIG. 5 illustrates exemplary contents of CAD context database 500 in an abbreviated form suitable for representation within the drawings of a patent application. As will be appreciated by persons of ordinary skill, the contents of a CAD context database as described herein will in practice be substantially more voluminous. In the examples illustrated in the figures provided herewith, CAD context database 500 is located within natural language program server module 122. However, it may be otherwise located without departing from the scope of the invention.

As illustrated in the example of FIG. 5, CAD context database 500 comprises a series of command topics in a first column and at least two super-columns thereafter that identify required information and corresponding search addresses or locations for information corresponding to each command topic. In this example, a "Yes" entry in any column indicates applicable or required information, and an "X" entry indicates that information is not required or not applicable. The required information super-column indicates each specific type of information that CAD analyzer 114 must pull from CAD model 120 to respond to a command related to the indicated topic or which must be obtained from a resource provider or other third party source. The search address super-column indicates applicable sources associated with each topic from which the required information may be potentially obtained. In this example, for illustration purposes, the search address columns have been populated with a number of well-known industrial suppliers—McMaster Carr, PEM and Metal Depot—but any source of information appropriate for the particular structures to be made may be populated in the search address columns. Also, when formula-based calculations are required, as explained in further detail below, the source of the formula may be a memory location or calculation engine located within the system or internally networked, in addition to third party or cloud sources.

Figure 6:
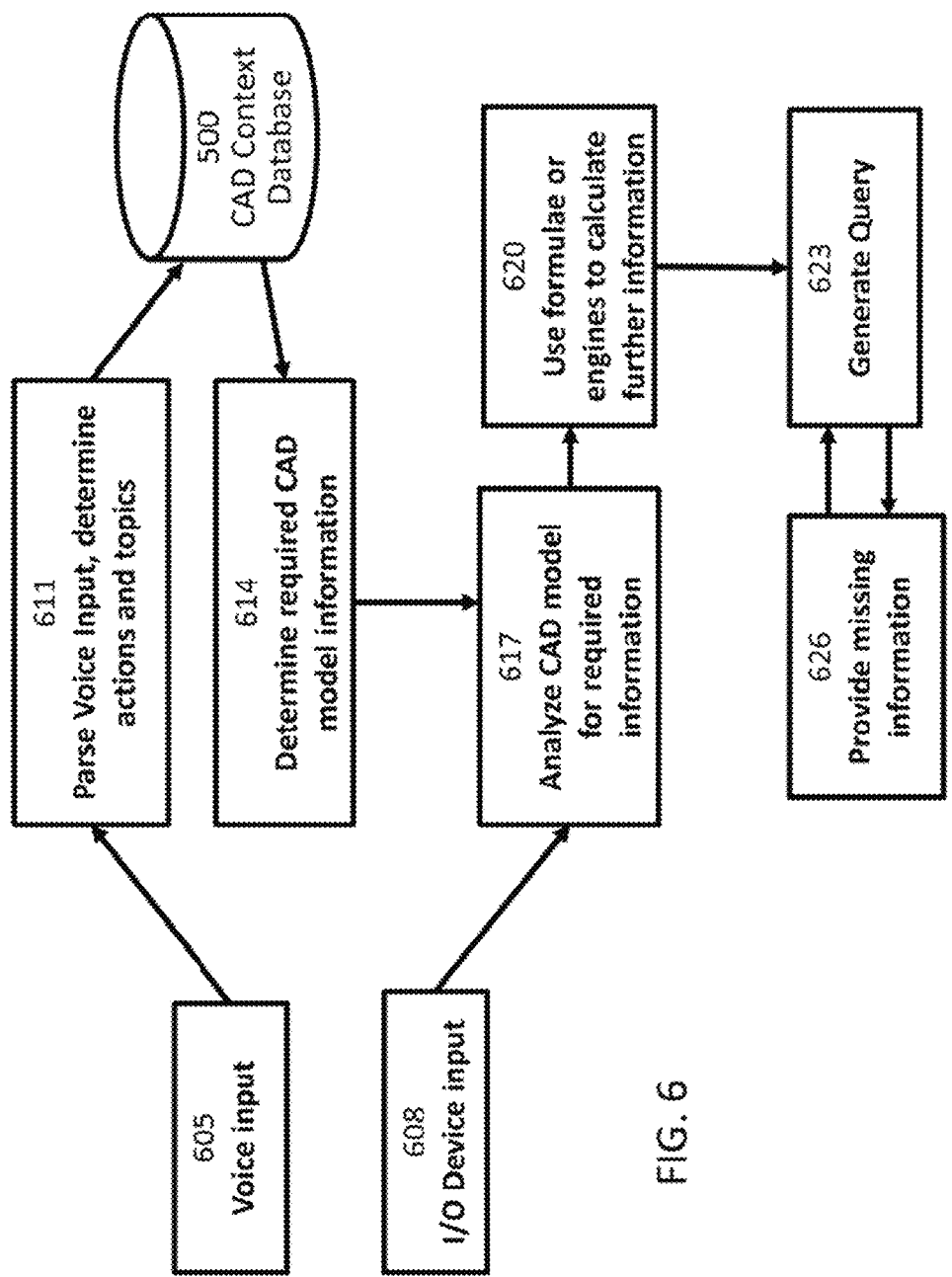
FIG. 6 is a flow diagram illustrating one possible embodiment of a query generation algorithm according to the present invention.

The information thus provided by CAD context database 500 is used to generate search queries, for example as shown in FIG. 6. The flow diagram of FIG. 6 illustrates one possible algorithm for query determination according to embodiments of the present invention, which will be illustrated by two examples with reference to FIG. 6 and Table 1 below. In step 605, a voice input is provided, such as "Nalcop, can you find a bolt to fit the selected hole?" Simultaneously or at a time in close proximity to the voice input, a device input is also provided in step 608. This device input may, in this example, be mouse clicking on a hole in the displayed structure from the CAD model. Next, at step 611 the voice input is parsed to determine actions, topics and required information. In this example, bolt as a topic returns needed information such as diameter, length, and material. This information is returned from CAD context database 500 as described above.

Based on information returned from CAD context database 500, at step 614, a determination is made as to the required CAD model information. In this example, required CAD information includes hole diameter, the material, and thickness of material at the hole location. With this information, at step 617, the CAD model is analyzed to extract the required information. In this example, extracted information may be diameter=0.5 in, thickness=1.5 in to 2.0 in, and material=aluminum. Once required information is returned, at step 620, formulae or engines are accessed and applied as needed to calculate further required information. In this example, max bolt diameter might be calculated at 0.95 in and minimum bolt length at 1.1 in.

With all necessary information in hand, a query is generated at step 623. A hypothetical query for this example may include the following fields and corresponding information: Address: McMaster Carr catalog; Action: search—Term 1: "bolt"—Term 2: "diameter=0.950 in"—Term 3: "length>1.65 in to 2.2 in"—Term 4: "material=aluminum". To the extent any information is determined to be missing, it is provided at step 626. For example, the length of fitting parts could be much longer than thickness of material, leading to many possible fitting results, in which case the natural language command program module will ask the user "What length part do you want?"

Table 1 below shows how the initial search request—"Nalcop, can you find a bolt to fit the selected hole?"—is parsed and the associated program actions and other associated events that flow from the request.

TABLE 1

| Parsed Voice Input | "Nalcop" | "can you find" | "a bolt" | "to fit" | "the selected" | "hole?" |
|---|---|---|---|---|---|---|
| I/O Device Association | N/A | N/A | N/A | N/A | "selected" = identify I/O device input for selected feature | N/A |
| Program Actions and Topics | "Nalcop" = Activate natural language program interface | "you find" = Action will be a search | "bolt" = Recognize CAD Context Term; Retrieve Term-Specific parameters for search from CAD | | Identify selected feature and determine associated parameters (e.g. hole diameter, depth & surrounding material) Construct query: "fit . . . selected hole" [verb + direct object] = correlate feature parameters (e.g. hole diameter, depth & surrounding | |

TABLE 1-continued

| Parsed Voice Input | "Nalcop" | "can you find" | "a bolt" | "to fit" | "the selected" | "hole?" |
|---|---|---|---|---|---|---|
| | | | Context Database | | material) with CAD Context Term Specific Parameters (e.g. bolt diameter, length & material) and other purchased parts compatibility data. | |
| CAD Context Database Interaction | N/A | N/A | Supply Term-Specific Parameters (for bolt, e.g., diameter, length, material) | | N/A | N/A |
| Resource Provider Extension Actions and Topics | N/A | Search | Address = McMaster Carr catalog Search term = bolt | Required corresponding CAD-interrogated information used to narrow search (e.g., Search term = diameter of hole; Search term = material; Search term = thickness of material) | | |

A second example follows that illustrates a variation of parameters when the request is for a stud rather than a bolt:

605 Voice Input—"Nalcop, can you find a stud to fit the selected hole?"
608 I/O Device Input—Mouse clicks on a hole
611 Parse Voice Input and determine actions and topics (Stud=diameter, length, material) by accessing CAD Context Database 500
614 Determine required CAD model information (CAD information=diameter of hole, thickness of material, material)
617 Analyze CAD model for required information (Diameter=0.25 in Thickness=0.090 in Material=Aluminum)
620 Use formulae or engines to calculate further information (Diameter +/−0.10 in Thickness=−0.007 in)
623 Generate Query Addresses (PEM catalog Action: search—Term 1: "stud"—Term 2: "diameter=0.15 in to 0.35 in"—Term 3: "thickness=0.083 in to 0.097 in"—Term 4: "material=aluminum")
626 Provide missing information (After query is executed, the length of the stud can be variable and independent of the part being analyzed, leading to many possible choices. NLCP Module 110 asks, "Is there a specific length stud you want?" This information is then added to the query as Term 5 and the query is executed again)

FIGS. 7A and 7B illustrate further alternative parsing and query algorithms, respectively, according to alternative embodiments of the invention. In each figure there are generic steps along the top row and a specific example in the boxes of the bottom row. In this alternative parsing algorithm there is voice input 702 plus I/O device input 704 plus CAD model data 706 that is the basis for output setting 708 plus action 710 plus direct object 712. The corresponding specific examples are, respectively, the voice input of natural language command program module 110 is "I need a bolt to fit this" 714 and mousing over the hole as I/O device input 716 plus CAD model data the hole diameter is half an inch and length is two inches 718, is the basis for a setting of purchased parts catalog 720, an action of search 722, and then the direct object or the search terms is "bolt of half an inch diameter and at least two inches length" 724.

The setting, action and object thus determined forms inputs to the query algorithm shown in FIG. 7B, wherein the setting 730 plus action 732 plus direct object 734 generate an address 736 plus action 738 plus search term(s) 740-744. These generic algorithm steps correspond, in this specific example, to, respectively, an actual query of purchased parts catalog 746 plus search 748 plus Bolt of 0.5 in diameter and at least 2 in length 750, provides a specific address of a resource catalog 752, a specific action of the search 754 and three search terms 756, 758 and 760 that come out of the direct object.

In one further embodiment, a local sub-server may be provided with specialized language databases that apply only to a group of designers so that the group may create or use their own individualized glossary commands and terms that might not be used by others outside the group and thus would not parse correctly. This would allow, for example, the users of that group to drop common adjectives from names when all parts have that name. For example, if all bolts were red, it would not be necessary for users within the identified group to specify a red bolt because the system would know the bolt color was red unless otherwise stated.

In another embodiment, a voice recognition sub-module may be included within natural language command program module 110 so that commands can be locked out from unrecognized voices to permit only authorized users to edit the CAD model. For example, such functionality may help to prevent untrained users from changing the CAD model inadvertently. Also, further functionality may be added to permit response by the system in natural language to questions about why a specific command or operation is not working. For example, if an initial command comprises a request to add a steel bolt to an aluminum structure and the system does not allow it because steel fasteners pull through the aluminum, the natural language command program module 110 would respond with an error message or say "this won't work" in audible tone all of the words—"this won't work for these reasons." This could be very helpful to users, especially for those people learning as they make mistakes and understand why it's wrong not just that it's wrong.

Another alternative embodiment may present help menu material tutorials as a natural language response, effectively reading the manual, so that, for example, the user may concentrate on the actions necessary with the keyboard and mouse without diverting his eyes to read from the screen.

In an embodiment, system may include a compatible components system permitting a designer to specify features or structures where components may be added to the CAD model. The system may then execute one or more methods designed to filter components made available to the designer using attribute information of the features and attribute information of the components. A feature may be a geometric representation of a part of a structure or an entire structure, which may be created with computer modeling software and may be embodied by surfaces, edges, and/or mounting holes, among others. A designer may interact with the compatibility methods numerous times, narrowing components through a series or number of filtering steps until a desired compatible component is easily selected. Methods and systems for such compatibility methods are disclosed generally in U.S. patent application Ser. No. 14/303,372, filed on Jun. 12, 2014, and titled "FILTERING COMPONENTS COMPATIBLE WITH A COMPUTER-MODELED STRUCTURE", which is incorporated by reference herein in its entirety.

Figure 8:
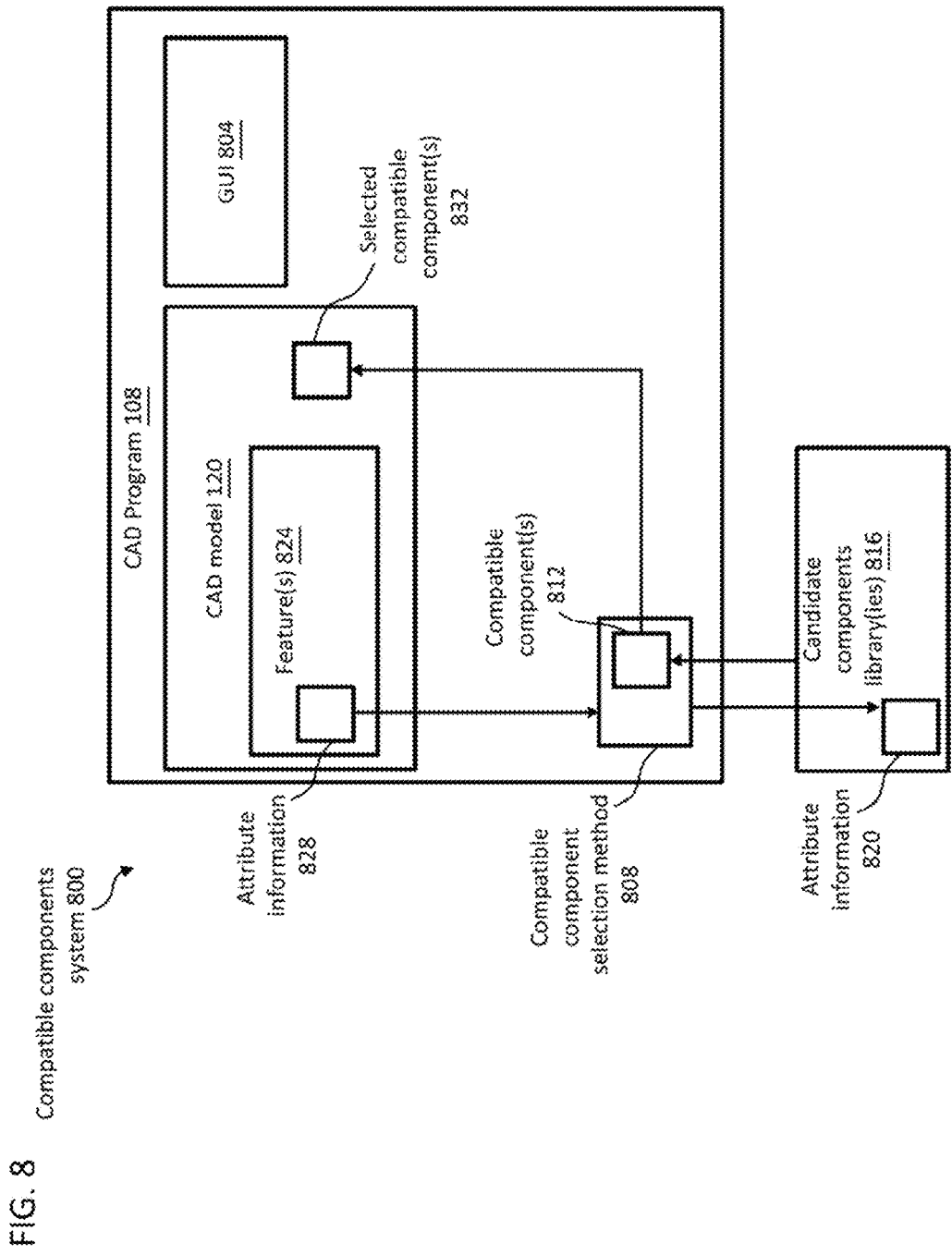
FIG. 8 is a high-level block diagram of a compatible components system made in accordance with the present disclosure.

FIG. 8 illustrates an exemplary compatible components system 800 of the present invention, which may be used for assisting designers with the selecting of components (e.g., hardware components, such as fasteners, nuts, studs, rivets, bolts, pins, screws, washers, hooks, cable tie-mounts, etc.) that are compatible with structures (e.g., pieces of sheet metal, solid cubes, cylindrical pipes, or assemblies of various parts such as vehicles, apparel, among others), which may be designed in computer modeling software. Compatible components system 800 may achieve one or more aspects of the present invention by dynamically filtering the components made available to designers through computer modeling software during the designing of structures. System 800 may dynamically filter components using information gathered from the computer model of the structure under design, as will be described in further detail below.

Illustrative hardware components that may be utilized in the present invention may be found in supplier hardware libraries such as the PEM® hardware catalog (available from Penn Engineering, Danboro, Pa.), the Southco product library (available from Southco, Inc., Concordville, Pa.), or the McMaster hardware catalog (available from McMaster-Carr Supply Company, Elmhurst, Ill.), for example. Components found in such catalogs may be provided in virtualized forms to designers or other users of computer modeling software as further described herein. Specification data information associated with said components, referred to herein as attribute information, may be provided to achieve benefits of the present invention.

As illustrated in FIG. 8, compatible components system 800 may include CAD program 108 that one or more designers may utilize to design structures represented in computer models, select components compatible with features of structures, and/or modify computer models to include and associate components with features of structures, among others things. CAD program 108 may comprise any program suitable for use as CAD program 108 as described above in reference to FIGS. 1A-B. CAD program 108 may include one or more CAD command program modules 108a-n as described above in reference to FIGS. 1A-B, and which may be linked by a template API 138 and interface with system 100 and/or compatible components system 800 as described above in reference to FIGS. 1A-B. As those skilled in the art will readily appreciate, CAD program 108 may reside on and/or be executed by any one or more pieces of computing hardware as particular configurations and implementations of the invention may require. Fundamentally, there is no limitation on the requirements of CAD program 108 as long as it is able to perform one or more of the functionalities describe herein.

Further, it is noted that the term "program" as used in "CAD program" is not intended to limit the implementation of the underlying functionality to any particular arrangement of the underlying software instructions, such as in a self-contained executable file. On the contrary, the term "program" is used merely to refer to one or more functionalities that a designer can implement in working with, for example, one or more CAD models. In order to enable designers to interact with CAD program 108, the computer modeling software may include a graphical user interface (GUI) 804, which may be operable to display, for example, one or more CAD models of structures, features of structures, attributes of features, hardware components, etc.

As alluded to above, CAD program 108 may operate on or otherwise utilize one or more CAD models, such as CAD model 120, which may comprise a computerized representation of a structure designed within the computer modeling software and/or another CAD program or application. CAD model 120 may include, for example, a series of lines, arcs, points, etc., and/or other information, such as detailed manufacturing information and/or specification data, associated with a structure to be fabricated. For example, CAD model 120 may comprise a 3D model created in CAD program 108 or imported from another program or source. CAD model 120 may be any CAD model 120 as described above in reference to FIGS. 1A-7B. CAD program 108 may be designed and configured to provide a compatible component selection method 808, which may provide one or more designers utilizing CAD program 108 with components that are compatible with, and thus may be included in, the design of the structure. In some embodiments, method 808 may include logic that automatedly determines compatibility between components and input structural features. For example, the logic may be implemented in the form of rules that define conditions in which components may be considered compatible with structural features. Illustrative rules that may be implemented as part of method 808 will be further described hereinbelow.

In one embodiment of system 800, compatible component selection method 808 may be implemented as a software component of CAD program 108. For example, method 808 may be implemented in the form of a plug-in module that adds application-level functionality to software 108. By way of another example, method 808 may be implemented as part of the executable code of software 108. In other configurations, method 808 may be implemented in a hosted software service model, in which case the method may be available to multiple instantiations of CAD program 108 over a network, such as the Internet.

Compatible component selection method 808 may source or retrieve one or more compatible components 812 from one or more candidate component libraries 816. Each library 816 may comprise one or more databases residing on, for example, a server, a hard drive, a compact disc, a flash drive, and/or cloud storage, among other known data storage devices/services. In some embodiments, each library 816 may include one or more categories of candidate components. Categories that may be present in library 816 may include, for example, nuts, studs, pins, screws, cable tie-mounts, fasteners, hooks, motors, buttons, drawer slides, and/or connectors. Each category may include one or more subcategories of components. For example, a category of nuts within library 816 may contain floating, blind, standard profile, flush, miniature, locking thread, and/or right angle nuts. Further, each subcategory may include one or more additional subcategories and/or one or more component parts. It is expressly contemplated that library 816 may contain virtually any number of levels in a categorical hierarchy of components.

Component library 816 may further include attribute information 820 associated with candidate components contained therein. As used herein, attribute information refers to technical specification information that may prevent a fabricator from fabricating a structure due to incompatibility between the component and a structural feature. Attribute information may consist of attribute fields (i.e., properties) and attribute values. For example, nut attribute fields may include thread size, recommended minimum sheet thickness, recommended maximum sheet thickness, hole size in sheet (including maximum and/or minimum hole lengths, maximum and/or minimum hole breadths, and the like), maximum shank length, minimum distance hole to edge, minimum sheet hardness, and/or material type. Generally speaking, while attribute fields may remain consistent across specific categories or subcategories of components, attribute values of component subcategories and/or individual component parts may vary. For example, in a component library of self-clinching studs for stainless steel sheets, each stud may contain a unique hole size in sheet attribute value. Attributes may include geometric properties, such as length, breadth, or cross-sectional area. Geometric properties may be geometric properties of an entire component or of a portion of a component; for instance, geometric properties may include one set of properties of a portion of component to insert into a hole or recess, such as the shaft of a bolt or stud that is inserted into a hole, the proportion of the shaft that is threaded or otherwise adapted to be fastened to another component or to a structure represented in CAD model 120. Continuing the example, a head of a bolt or stud or the like may have differing cross-sectional area, for instance to prevent bolt or stud from slipping through a hole. Attributes may include compatibility data concerning one or more other components or structures. Compatibility data may include data describing one or more additional components that may be combined with at least a component, such as one or more nuts that may be combined with a bolt. Compatibility data may include material compatibility data, such as materials suitable for construction of structures that may be combined with at least a comopnent.

One or more elements of system 100 may derive additional attributes using data stored in component library 816; for instance, maximum hole length may be derived by analysis of geometric features of a bolt or stud, including without limitation length of a shaft of bolt or stud, portion of the shaft that is threaded or otherwise adapted for attachment to other components or to structures represented in CAD model 120, or the like. Minimum hole breadth may similarly be deduced from cross-sectional area of an element to be inserted in hole, while maximum hole breadth may be deduced from geometric dimensions of a head portion, nut, or other element of at least a component that is designed to secure at least a component or one or more other structure at hole. System 800 and/or system 100 may derive additional attributes by applying one or more rules stored in memory of system 800 and/or system 100; for instance, a rule indicating that steel studs should not be used to fasten aluminum sheeting may be combined with attribute data indicating that at least a component is a steel stud to eliminate use of steels stud. In an embodiment, CAD model analyzer 114 performs comparisons to determine additional attributes from data stored in component library 816; for instance, CAD model analyzer 114 may use geometric comparison to determine that threading on at least a component is compatible with threading on an additional component and/or structure. Both rules-based and interrogation-based deduction may be combined; for instance, a rule may require that a particular kind of sheet metal have a thickness higher than a certain minimum quantity to be fastened with a particular category of bolt matching at least a component, while CAD model analyzer 114 may determine that shaft length of the at least a component requires a hole length less than the minimum quantity, from which the system 100 and/or system 800 may determine that the bolt is not compatible with the sheeting.

Components may be stored in component library 816 in a form that permits their representation as CAD models in CAD program 108. Components may be stored as CAD files or CAD models. Components may be stored as data that may be converted to a CAD file or CAD model 120.

In one embodiment, system 800 may be configured such that CAD program 108 and component library 816 are executed and stored on the same computing device, in which case the software and library may be operatively connected via a local bus. In other embodiments, system 800 may be configured such that software 108 and library 816 are executed and stored on separate computing devices (e.g., in a distributed computing model) and operatively connected via a network (e.g., local area network, wide area network, and/or Internet connection). CAD model 120 may include one or more features 824 that are added, specified, or otherwise associated with the model, for example, as the structure is created. In the context of the present disclosure, features 824 refer to distinctive attribute(s) or aspect(s) of CAD model 120 that may receive one or more components. Examples of features include discrete pieces of structural geometry, such as a face, a hole, a slot, and an edge of a structure. CAD model 120 may further include attribute information 828 associated with the one or more features contained therein. As described hereinabove, attribute information may include attribute fields and attribute values. For example, the attributes of a given feature may be characterized as non-geometric, such as the material type associated with the feature; geometric, such as the material thickness or diameter associated with the feature; and/or whether features are part of an assembly, among others.

CAD model 120 may further include one or more selected compatible component(s) 832, such as a geometric representation of selected components. Each component contained within or specified by the model may include geometric information (e.g., a series of lines, arcs, points, etc.) and non-geometric information (e.g., attribute information such as material type, thread size, number of pins), for example.

In some embodiments in which CAD model 120 may be represented as one or more computer-aided design (CAD) files, for example, method 808 may write geometric and/or non-geometric information regarding the selected compatible component(s) 832 directly into such files. In other embodiments, method 808 may write pointers or otherwise dynamically link the information and CAD files, which enables dynamically updating the information in the CAD model 120 if and when information in library 816 changes. Those skilled in the art will recognize that these two techniques represent exemplary ways in which components may be associated with hardware and that other suitable association methods may be utilized in accordance with other embodiments of the invention.

Figure 9:
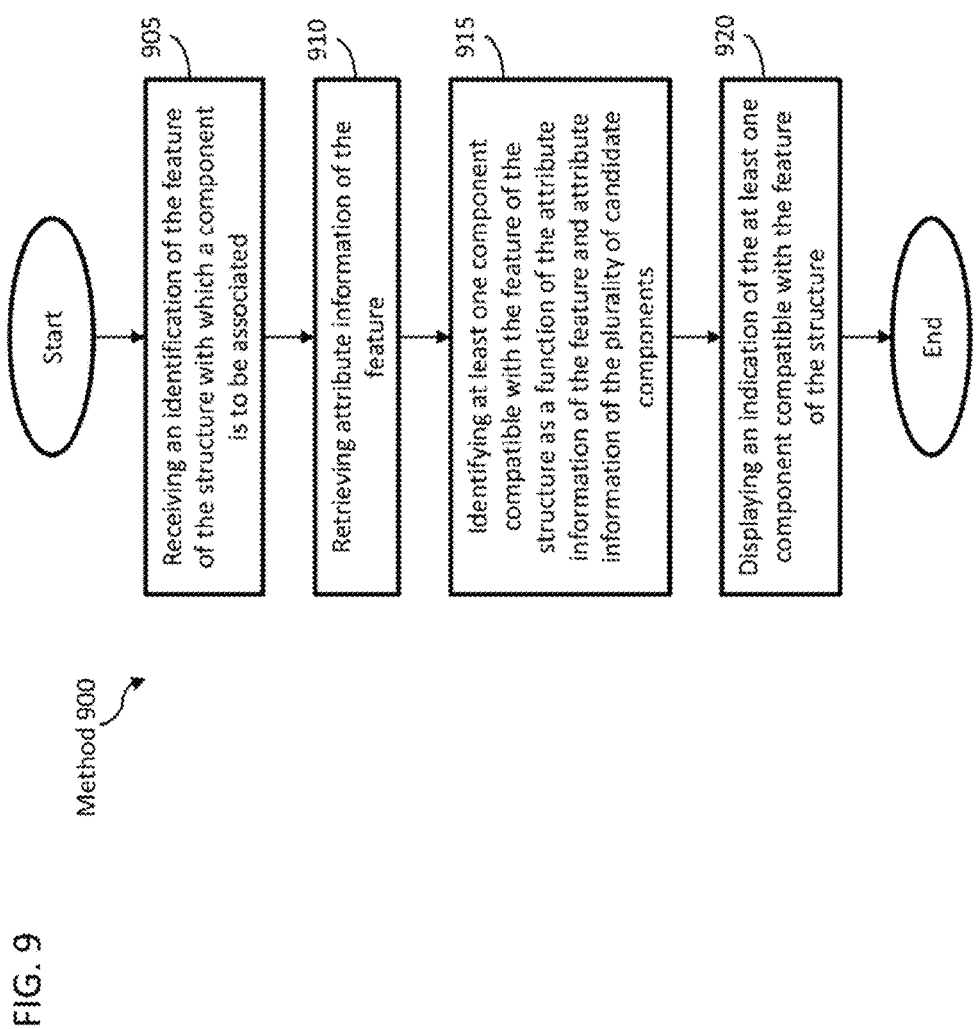
FIG. 9 is a flow diagram illustrating an exemplary method of assisting designers with selecting components compatible with features or structures represented in computer models.

Reference is now made to FIG. 9, and also to FIG. 8 for exemplary context. FIG. 9 illustrates an exemplary embodiment of a method 900 of assisting designers with selecting components compatible with features or structures represented in computer models that can be implemented, for example, by one or more components of compatible components system 800, as appropriate. At step 905, CAD program 108 may receive an identification of a feature of a structure with which a component is to be associated. In some embodiments, through GUI 804, a designer may identify the feature for software 108 by selecting a feature present in CAD model 120. For example, the designer may select a surface, an edge, or a mounting hole, among others. As another example, designer may select a recess or projection that the designer wishes to attach to or match with a corresponding feature of a component. As introduced hereinabove, the designer may use CAD program 108 to add, specify, or otherwise associate features with CAD model 120 in creating the design of the structure. The designer may then, through GUI 804, issue a request to compatible component selection method 808 for compatible components design assistance.

In other embodiments of step 905, through CAD program 108 and GUI 804, the designer may identify CAD model geometry that contains one or more features. CAD program 108 may read the feature(s) from CAD model 120 and present them to the designer in the form of a selectable list via GUI 804. The designer may then select a specific feature with which a component is to be associated. Alternatively, designer may indicate a location, and CAD model analyzer 114 may identify geometry at, containing, or surrounding the location; for instance, CAD model analyzer 114 may identify the location as being located at a feature such as the features described above, and may determine that the designer intended to select the feature. CAD model analyzer 114 may cause system to prompt the designer with the identity of the feature. CAD model analyzer 114 may determine that a feature is near to the location selected by the designer; CAD model analyzer 114 may prompt designer regarding feature near to the location. CAD model analyzer 114 may identify a plurality of features at, near, surrounding, or containing location. CAD model analyzer 114 may determine that one of the plurality of features is the selected feature; for instance, CAD model analyzer 114 may determine which feature is closest to the location. As a non-limiting example, where location is within a first feature and near to a second feature that is also within the first feature, CAD model analyzer 114 may determine that designer intended to select second feature; alternatively, CAD model analyzer 114 may determine that the designer intended to select the first feature. As another non-limiting example, where location is nearer to a first feature than a second feature, CAD model analyzer 114 may determine designer intended to select first feature. Where location is within a first feature that is within a second feature, CAD model analyzer 114 may determine designer meant to select first feature, or second feature, depending on configuration of CAD model analyzer 114. CAD model analyzer 114 may present multiple features at, surrounding, containing, or near location to designer, for instance in the form of a list such as a drop-down or other list, and receive a selection of the intended feature from the designer. Where CAD model analyzer 114 determined the selected feature as described above, CAD model analyzer 114 may present designer with a list of alternative features to select instead; the designer may alternatively enter a command, for instance via a button or other event handling feature, indicating that the designer did not intend to select the determined feature, which may prompt CAD model analyzer 114 to perform a second determination that excludes the previously determined feature.

Designer may enter a command requesting a particular component type; component type may be any category into which components may be sorted. For instance, one component type may be fasteners used to join two or more structures together. Component types may be subtypes of other component types; for example and without limitation, a subtype of fasteners may be bolts, or studs, which may also have further subtypes such as locking bolts. Further examples of component types may include other structural elements of designs to be manufactured, including without limitation shafts, gears, cams, bars, sheets, bearings, wheels, wedges, levers, pullies, circuit elements, and any family of structures related by geometric form, function, use, or other categorization.

At step 910, CAD program 108 may retrieve attribute information of the feature identified at step 905. In some embodiments, CAD model 120 may contain the attribute information and software 108 may retrieve the attribute fields and values directly from this CAD model information. The information retrieved may comprise all available attribute information associated with the feature or a subset thereof. In some embodiments, the subset of information may be dependent on specific component types of interest identified by the designer through GUI 804. By way of one example, a designer may furnish a request for only nuts, in which case CAD program 108 may retrieve only attribute information that may present compatibility issues with nuts. By way of another example, a designer may furnish a request for a specific type of stud (e.g., a concealed head stud), in which case CAD program 108 may retrieve only or at least the attribute information (e.g., sheet thickness) that impacts compatibility with this specific type of stud. In an embodiment, CAD model analyzer 114 may extract one or more attributes of feature, as described above and in incorporated references for extraction of feature attributes, geometry, or the like. CAD model analyzer 114 may derive attributes similarly to the derivation of attributes of components as describe above.

In other embodiments of step 910, CAD program 108 may prompt the designer to provide attribute information needed for purposes of components compatibility. By way of one example, compatible components systems may require the material type of a part, yet the CAD model 120 may not have this information as the designer may fail to specify during structural design. In such cases, the identification of a feature at step 905 may include or be accomplished by system 800 prompting the designer to obtain such information before proceeding to step 915. All of the above-described methods for obtaining attribute information may be combined in any way; for instance, some attributes may be entered by the user, some recovered from the CAD model 120 directly, some derived from data stored with CAD model 120, and some derived using rules and/or geometric analysis.

At step 915, compatible component selection method 808 may identify one or more candidate components 812 (i.e., components compatible with the designated feature) from one or more available libraries of components 816. In some embodiments, method 808 may compare feature attribute information extracted at step 910 against candidate component attribute information present in libraries 816, or candidate component attribute information derived by any other method described above. Based on the results of one or more comparisons, method 808 may select component(s) or component group(s) with attribute values that match feature attribute values. A match may refer to components and features that share the same attribute values, have attribute values within a predetermined acceptable tolerance, or other pre-defined rules regarding compatibility. As a non-limiting example, system 800 may retrieve a plurality of component representations, each of which may include CAD or other graphical representations, attribute information, and the like, and may use CAD model analyzer 114 to test compatibility of each component of the plurality of components against compatibility of any other component of the plurality of components according to any method or facility usable by CAD model analyzer 114 as described above and in disclosure incorporated herein by reference; components that are not compatible may be eliminated, leaving a list of compatible components. As another non-limiting example, one of more attributes may be linked to representations of components by a database or other data store or data structure, and system 800 may create a query using attributes of feature, and retrieve components matching the query. A combination of the above approaches may be used; a query may return components matching attributes in a query, and then further components may be eliminated by compatibility comparisons using CAD model analyzer 114. Logic that automatedly determines compatibility between components and structural features frees designers from needing to manually check the compatibility between every desired component and the computer model under design.

It should be noted that retrieved component or components may be another structure represented in another CAD model similar to CAD model 120; furthermore, when retrieved component or components have been retrieved, one or more steps of method 808 may repeat to find another component to match with the first retrieved component and the feature, such as a fastener to connect the first component to the feature. For instance, the feature may be a surface with one or more through-holes, the first component may be another part that fits against the surface with matching through-holes, and the second component or set of components may include one or more bolts or studs to insert into both sets of through holes to fasten the first component to the surface.

At step 920, software 108 may display an indication of categories or subcategories of components or specific individual component parts that are compatible with the feature of the structure. In certain embodiments, compatible component selection method 808 may transmit candidate components 812 back to CAD program 108, whereby the software may provide the information to the designer, e.g., via GUI 804. In other embodiments, alternative output communication methods known to those skilled in the art, such as audio, audiovisual, tactile methods, etc., may be utilized to indicate compatible components to the designer. Where designer has entered a category of component desired, software 108 may eliminate otherwise matching components, for instance as retrieved above, that do not match the category. As a non-limiting example, where either bolts or studs may match a through-hole, and designer has specified that studs are desired, bolts may be eliminated from the list of compatible components displayed to the designer.

In some embodiments, designers may input a selection of a component from among candidate compatible components identified at step 920. System 800 may then associate the designer-selected component with the feature(s) of the computer-modeled structure as described hereinabove. Additionally or alternatively, in some embodiments, designers may further filter the list of candidate compatible components. For example, some or all steps of method 900 may be executed in an iterative process to further refine the list of compatible components until a final component is selected. Such optional processes will be described further hereinbelow with reference to a specific example of the method as applied to sheet metal parts. Additionally or alternatively, steps of method 900 may be repeated automatedly by system 800 until only one component selection remains; component selection may then be automatically added to feature. CAD model 120 and/or CAD file containing CAD model 120 may be modified to include feature with added component. Thus, method 900 may receive only designer indication of a type of component needed, and proceed to automatedly match component and add to CAD model 120 without further user interaction. In an embodiment, designer may specify a first component to match to feature, for instance using method 900; subsequently, method 900 may repeat automatedly to retrieve a second component suitable for matching first component and feature, and generate a new CAD model 120 representing feature and first component joined by second component.

Figure 10:
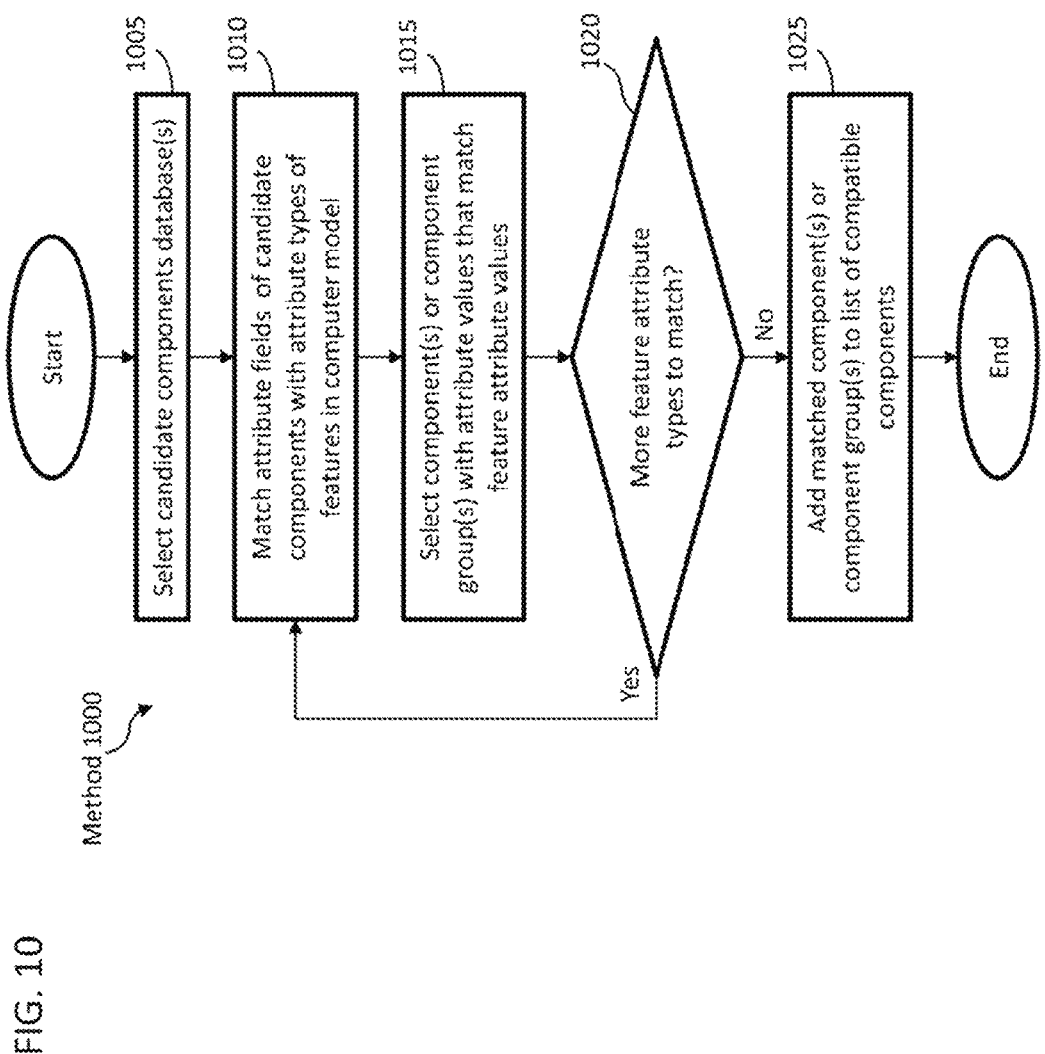
FIG. 10 is a flow diagram illustrating an exemplary method of identifying components compatible with features or structures represented in computer models.

Reference is now made to FIG. 10, and also to FIGS. 8 and 9 for exemplary context. FIG. 10 is a flow diagram illustrating an exemplary automated compatible component identification method 1000. In some embodiments, compatible component selection method 808 may execute method 1000 to automatedly identify components that are compatible with specific CAD model features. At step 1005, method 808 may establish a connection to one or more candidate component libraries (e.g., library 816). In some embodiments in which the library takes the form of a database, method 808, acting as a client, may utilize middleware, such as Open Database Connectivity (ODBC), to connect and communicate with the candidate component library. Other connection methods may be utilized; for example, in compatible component system configurations involving multiple candidate component libraries, method 808 may utilize a plurality of different connection methods. In addition, selection method 808 may search CAD models of other structures stored in memory or retrieved over a network, as potential components; these may be added to library or directly evaluated.

At step 1010, method 808 may proceed to match one or more attribute field(s) of the structural feature against one or more corresponding attribute fields for each the components present in library 816. By way of one example, method 808 may apply logic that compares non-geometric attribute values of the structure against the non-geometric attribute values defined for each component. By way of another example, method 808 may apply logic that compares geometric attribute values of the structure against the geometric attribute values defined for each component. In some embodiments, such logic may utilize a predefined threshold to determine whether the component is compatible on the basis of particular attribute data, such as field pairs. The values of a component attribute field may be used as the threshold (e.g., the length from edge to hole on a face may have to be greater than a component's minimum distance hole to edge attribute value). In other embodiments, such logic may utilize an absolute or equivalent condition. For example, the logic may compare material type values.

At step 1015, method 808 may select one or more components or component groups with attribute values that match feature attribute values, as determined at step 1010. Method 808 may identify those components or component groups with a unique designation that signifies they are compatible based on matched feature attribute values. In some embodiments, at step 1020, compatible component selection method 808 may determine whether there are additional matches between attribute fields of the structural feature and attribute fields of the components required to further narrow the compatible components list. If there are additional matches, method 808 may return to step 1010 and the additional comparison is performed. If there are no additional matches to be made, method 808 may proceed to step 1025, at which method 808 may add selected components or component groups, as determined at step 1015, to a list of compatible components, such as compatible components 812.

For example, as part of step 1025, for components determined to be compatible on the basis of one or more comparisons, method 808 may extract the components and/or unique indicators of the components from a library, such as candidate component library 816, and store them in a separate list or other data structure designed to identify compatible components, such as compatible components 812. Such a list may include, but is not necessarily limited to, component attribute data, component images, and/or component category or subcategory data. In some embodiments, method 1000 may transmit the one or more lists of compatible components to computer modeling software. As described in method 900, computer modeling software may present such compatible components to designers, e.g., for inclusion in CAD models.

Exemplary Method Applied to Sheet Metal Parts

Figure 11:
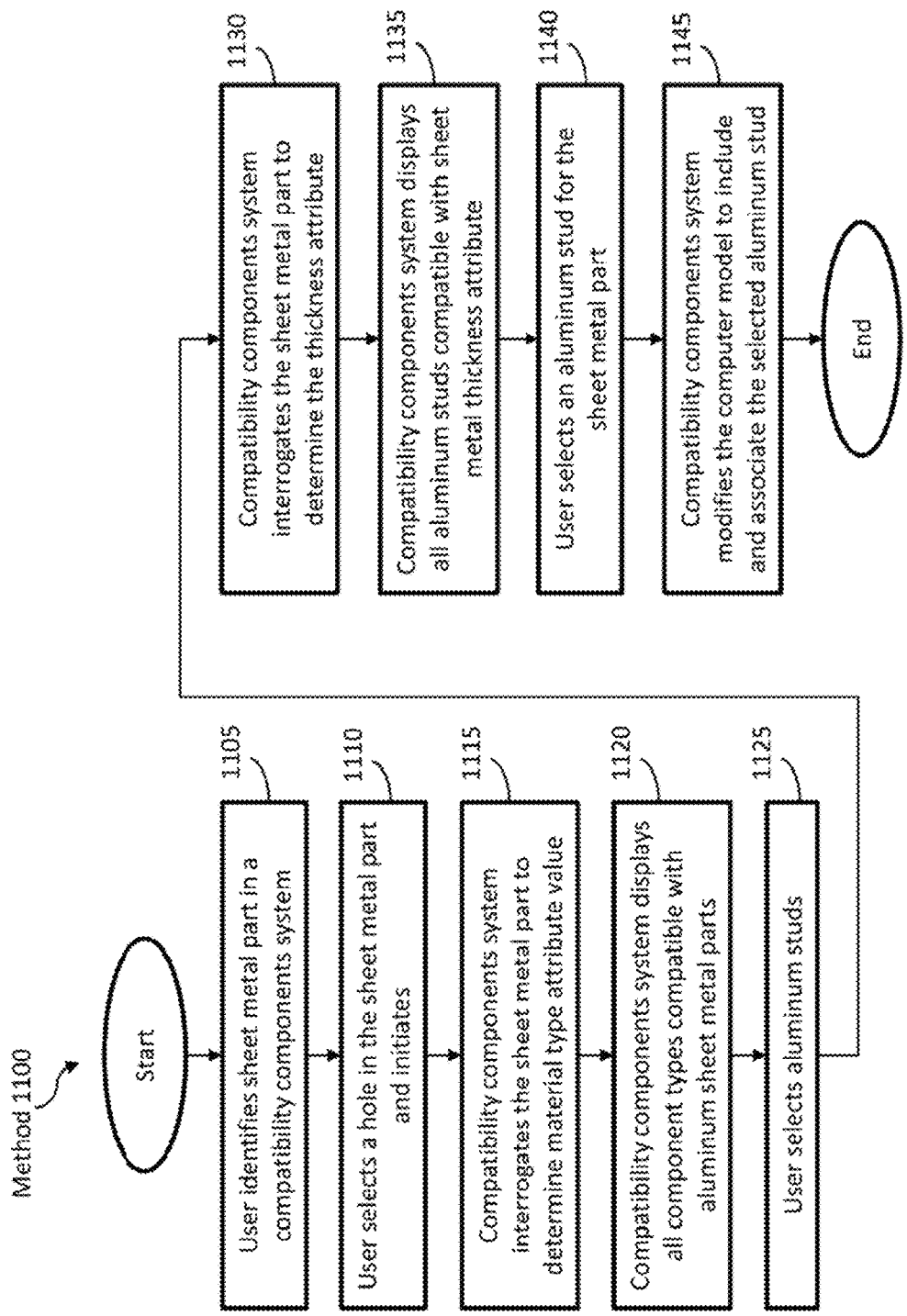
FIG. 11 is a flow diagram illustrating an exemplary method of using a compatible components system to add studs to sheet metal parts.

FIG. 11 illustrates an exemplary method 1100 for applying the compatible components selection methods described herein in a scenario involving the computer-aided design of sheet metal assemblies. The following examples further illustrate how designers may utilize the methods described herein in iterative processes to identify and/or filter CAD model 120 compatible components. In particular, the following examples further illustrate how compatible component systems may make different compatibility evaluations when designers select specific categories or subcategories of components.

Figure 12:
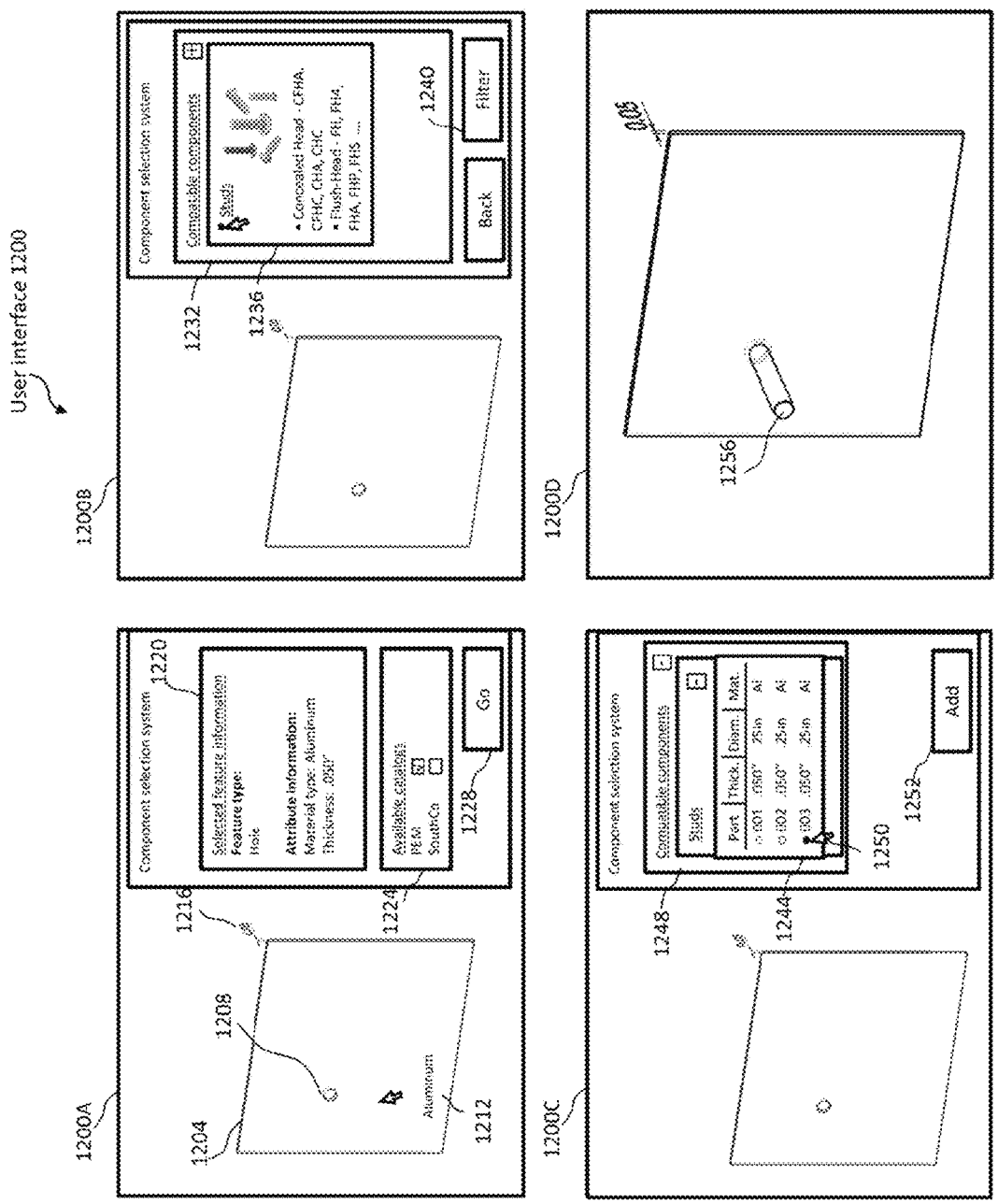
FIG. 12 is a series of representative screenshots depicting various aspects of an exemplary user interface that may be presented to designers or other users of a compatible components system.

When describing method 1100, references will also be made to FIGS. 5, 6 and 7. FIG. 12 illustrates a series of representative screenshots depicting various aspects of an exemplary user interface that may be presented to sheet metal designers at various stages through method 1100. FIGS. 6 and 7 are depictions of exemplary component library listings of studs that may be accessed and/or made available to sheet metal designers during execution of method 1100.

At step 1105 of method 1100, a designer may identify a sheet metal part in a compatible components system. For example, the designer may invoke CAD program 108 and design a sheet metal part 1124, a visual indication of which may be shown in a GUI, such as GUI 804 and/or GUI 1900A, as illustrated in in FIG. 12. Alternatively, the designer may select a pre-existing sheet metal part, which may include feature(s) and attribute information associated with each feature. For example, as shown in FIG. 12, part 1124 may include a hole 1128 and a designation 1212 indicating that aluminum is the desired type of material that a sheet metal fabricator should use in the fabrication of the part.

At step 110, the designer may select hole 1128 in sheet metal part 1124 and initiate a request to system 800 for compatible components design assistance. To initiate the request, for example, the designer may select a component selection system initiation button (not shown) in or associated with CAD program 108. In response to initiation, a compatible components selection method, such as compatible components selection method 808, may then monitor the designer's continued interaction with software 108 for any number of predetermined component-related selection events. For example, one such event may comprise the selection of any hole in the sheet metal part.

At step 115, system 800 may interrogate sheet metal part 1124 to determine attribute information, such as one or more field values, that may impact compatibility with hardware components. For example, system 800 may read attribute field values associated with material type 1212 and material thickness 1216. As shown in FIG. 12, a selected feature information panel 1920 may visually display selected feature and attribute value information to the designer. A component sourcing panel 1224 may also present component sourcing options to the designer. For example, a designer may opt for system 800 to provide compatible components exclusively from the PEM hardware catalog.

At step 1112, system 800 may display all component types compatible with aluminum sheet metal parts. To identify this information, system 800 may execute compatible component selection method 808 in response to designer request initiation. As illustrated in GUI 1900A of FIG. 12, the designer may initiate the request by selecting a "Go" button 1228. FIG. 13 provides a detailed example of a component library of self-clinching studs that may be stored in one or more portions of a compatible components system, such as candidate components database 816. Some of these studs are compatible with aluminum sheet metal parts as indicated by fastener material type attribute 1304 (in the case of aluminum, FHA indicates compatibility, while a dash indicates an incompatibility).

As illustrated in GUI 1900B of FIG. 12, system 800 may utilize a compatible components panel 1232 to determine and/or output specific categories (i.e., classes or groups or types) of components compatible with aluminum sheet metal parts. As illustrated in GUI 1900B, panel 1232 may display additional information about each category, such as a name, one or more component pictures, and one or more component categories. Although panel 1232 in FIG. 12 displays only studs, a virtually limitless number of compatible component types.

At step 1205, the designer may initiate a request to system 800 to return (e.g., through GUI 804) all aluminum studs that are compatible with hole 1128; other categories of aluminum components may not be returned by the system. To initiate the request, for example, the designer may select a component type indicator 1236 provided in panel 1232 and select a "Filter" button 1160. At step 1130, system 800 may respond to the request by interrogating sheet metal part 1124 to determine one or more values associated with the part's material thickness 1216, which may be 0.05 inches thick, for example, as illustrated in FIG. 12.

Figure 14:
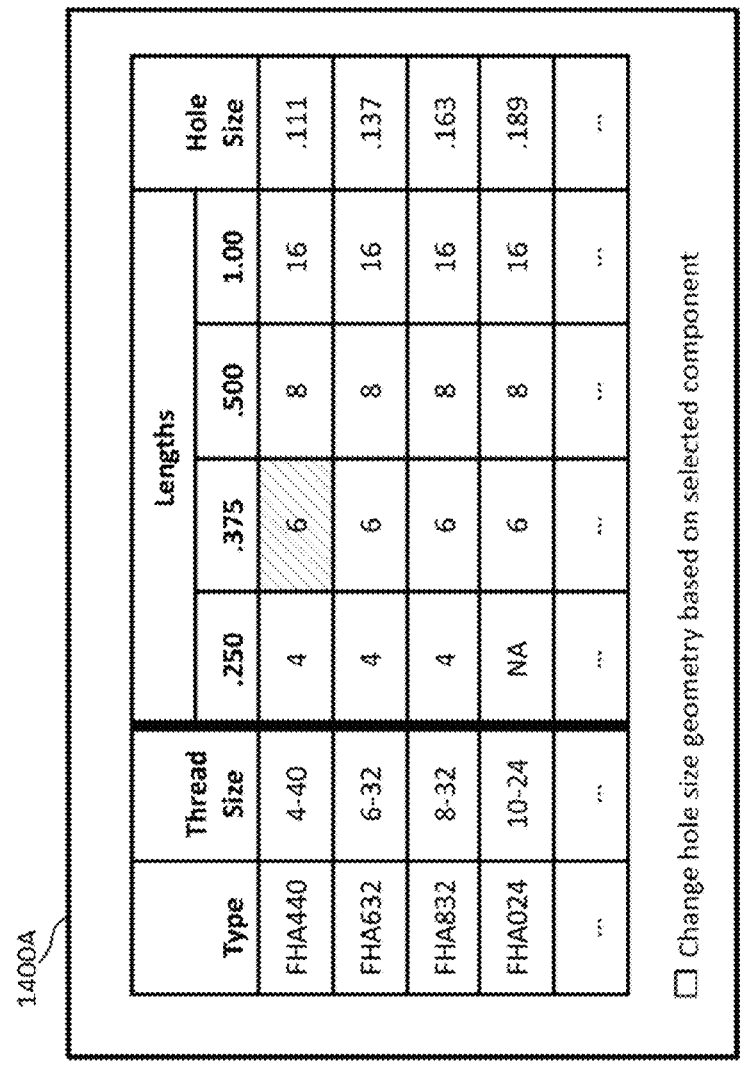
FIG. 14 is a depiction of an exemplary listing of aluminum studs that may be made available to designers by a compatible components system.

At step 1135, system 800 may output (e.g., display to GUI 804) a number of or all aluminum studs that are compatible with the thickness of part 1124. For example, if a part identified by a user at step 1105, such as part 1124, has a thickness of 0.05 inches, then all studs output by system at step 1135 will be compatible with a sheet thickness of 0.05 inches. As shown in GUI 1900C of FIG. 12, the compatible aluminum studs 1164 may be visually displayed to the designer via a compatible components panel 1168. FIG. 84 provides a detailed example of a compatible components panel 11100A that presents four specific studs that are compatible with sheet metal part 1124. Each stud presented in the panel is compatible with both the material type and material thickness of part 1124. Note that certain components present in a library may be compatible with one feature attribute but not all feature attributes. For example, the stud with thread size 0.250-20 designated with "FHA" (aluminum compatible) and "01812" (thread code) in FIG. 13 is an aluminum component, but because this component requires a 0.60 inch minimum material thickness, system 800 may consider this component incompatible and thus may not display it in panel 1400A (FIG. 14).

At step 1132, the designer may select an aluminum stud that they desire to add to sheet metal part 1124. To provide this selection, for example, the designer may select a component selector 550 associated with the desired aluminum stud and then select an "Add" button 1252. As illustrated in FIG. 14, in some embodiments, the designer may select a specific aluminum stud by length, for example, by selecting a user interface element, such as a button or selectable cell, located at the intersection of 0.375 inch length and aluminum stud thread code "1832" in aluminum stud listing 1400. Notably, in some embodiments, after step 1135, a designer may continue to iteratively filter components (e.g., by returning to step 1205) prior to the selection of the final components to be added to the CAD model 120. In some cases, designers may filter lists of candidate components six or more times before arriving at the appropriate component.

In some embodiments of the invention, system 800 may provide designers with the option to change or modify geometry in the CAD model 120 based on a selected component. For example, as illustrated by the user interface element located near the bottom of FIG. 14, the designer may opt to change the size of a hole according to the hole size attribute information of the selected component.

Illustrative embodiments for modifying CAD model geometry as a function of selected components may be found in, for example, U.S. patent application Ser. No. 14/195,391, filed on Mar. 3, 2014, and titled "HARDWARE-COMPONENT BASED GEOMETRIC MODIFICATIONS OF COMPUTER-MODELED PART DESIGNS", which is incorporated by reference herein.

At step 1145, system 800 may modify computer model 804 to include and/or be associated with the selected aluminum stud, optionally including geometry representing the stud. For example, stud specific information may be written directly into computer model information. This information may include any of the illustrative attribute fields and values referenced herein, among others. As illustrated in GUI 1200D of FIG. 12, a selected aluminum stud 1256 may be visually displayed to demonstrate a relationship between the structure and the component. In some embodiments, as shown in GUI 1200D, the component, in this case stud 1256, may be displayed as being engaged with the feature of the structure (i.e., hole 1128 of part 1124).

Alternative System Embodiments

Figure 15:
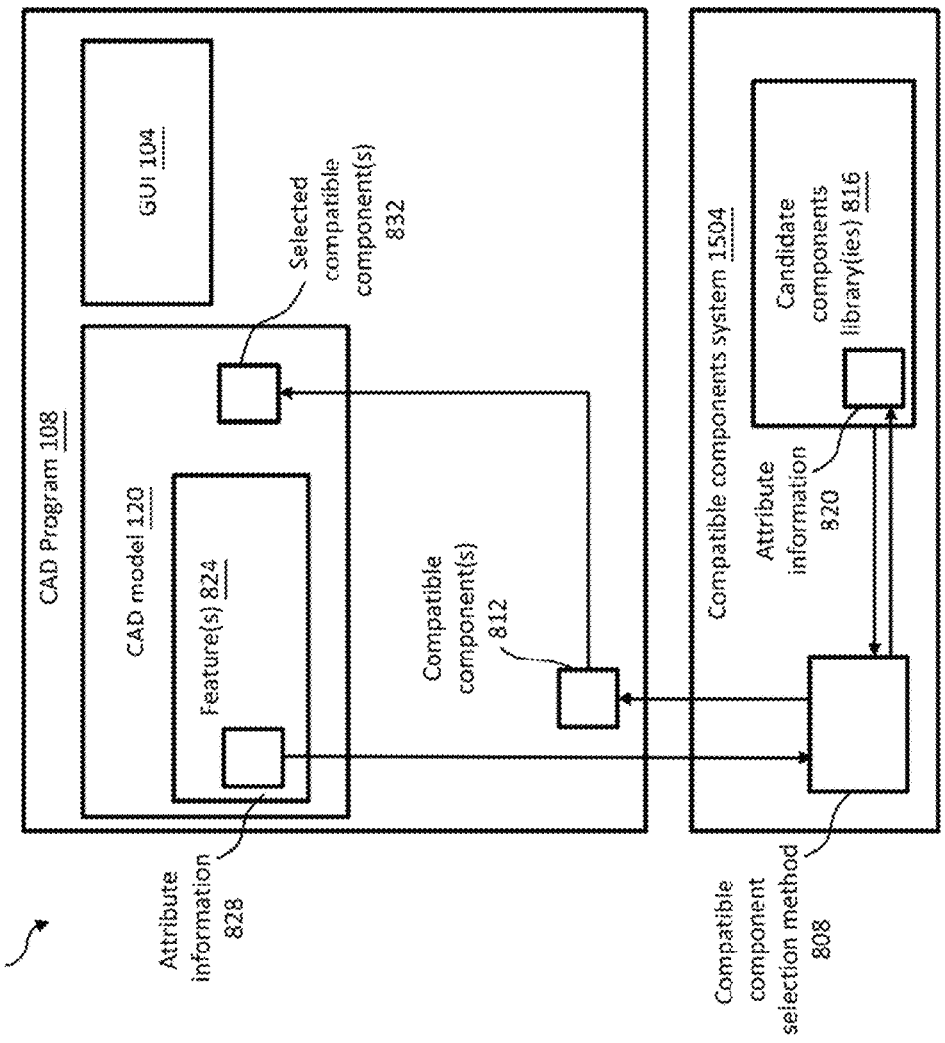
FIG. 15 is a high-level block diagram of a system for assisting designers with selecting components compatible with features of structures represented in computer models.

FIG. 15 illustrates an alternative embodiment of a system 1500 for assisting designers with selecting components compatible with features of structures represented in computer models. System 1500 illustrates a configuration in which a compatible component system 1504 stores both the compatible component selection method 808 and one or more candidate component libraries 116. The compatible component system 1504 and CAD program 108 are physically separate (e.g., in a distributed computing model) and may be operatively connected via a network (e.g., local area network, wide area network, and/or Internet connection). In operation, CAD program 108 may transmit attribute information 128 to method 808 over the network. After execution of method 808 to identify candidate components in library 816, method 808 may transmit candidate components 812 to the CAD program 108 over the network. In contrast to system 800 of FIG. 8, this particular system configuration embodiment may provide hardware component suppliers with individualized control over the rules and logic utilized to execute component compatibility decisions. For example, as hardware component suppliers add or modify hardware components and/or attribute data stored in library 816, additional rules and logic that indicate conditions when these components should be considered compatible with features of computer models may be added to method 808.

Figure 16:
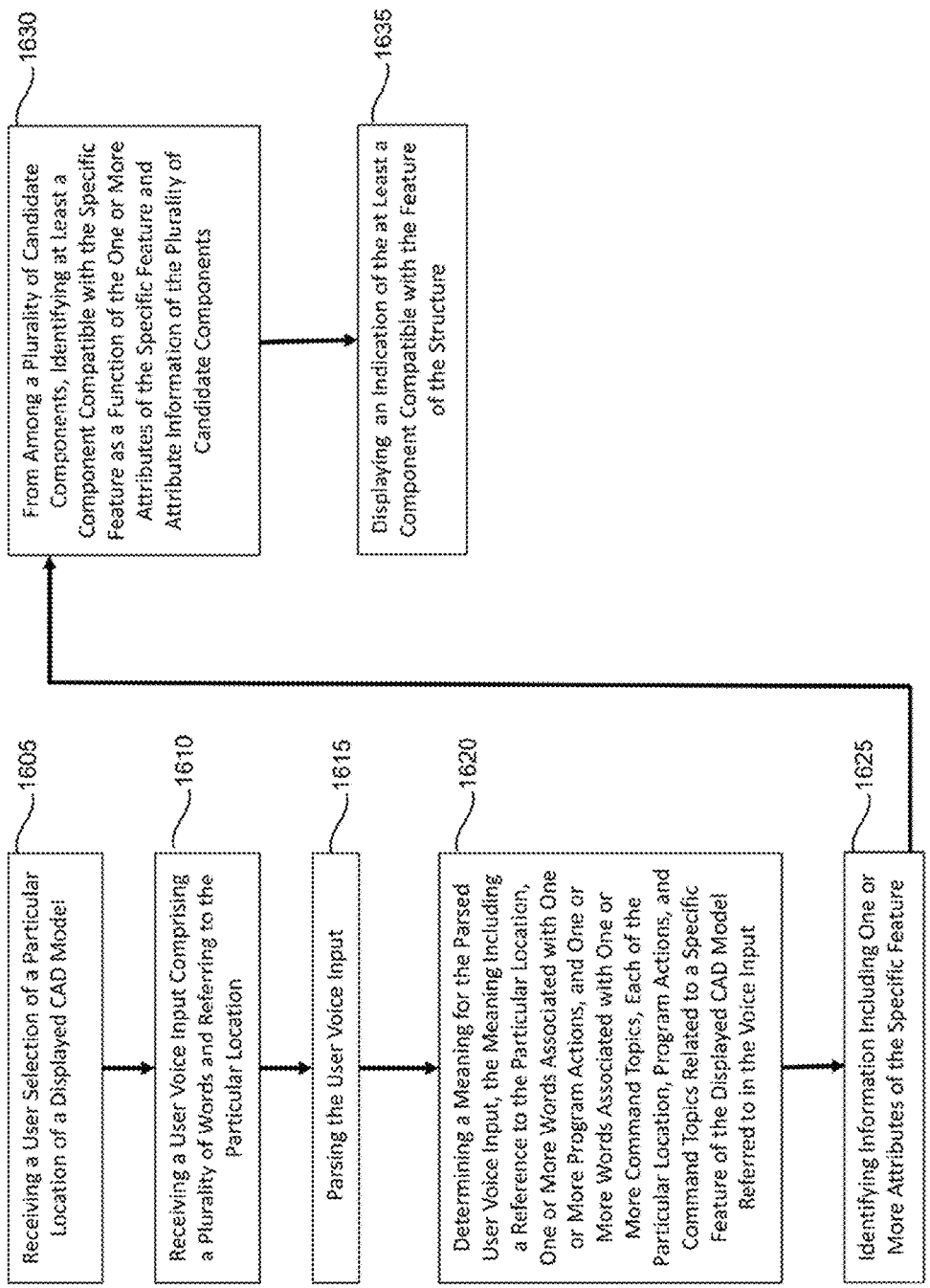
FIG. 16 is a flow diagram illustrating an exemplary method according to an embodiment of the present invention.

Referring now to FIG. 16, an exemplary embodiment of a method 1600 of providing a natural language interface for a computer-aided design (CAD) system is illustrated. At step 1605, a user selection of a particular location of a displayed CAD model 120 is automatedly received through a graphical user interface (GUI) via an input device of a computing device. Particular location may be selected according to any means or method described above for selection of a particular location. Particular location may be selected using a voice command, from which system 100 may extract particular location data according to any steps or combination of steps described above for use of a natural language user interface. Receiving user selection of particular location may be include identifying, using determined meaning of the user voice input, a feature of the displayed CAD model 120, and identifying a location at the feature of the displayed CAD model 120. As used herein, location "at" the feature may include without limitation a location located within the feature, surrounded by the feature, or adjacent to the feature; location may be a location to which the feature is "nearest" as described above. CAD model analyzer 114 may be used to identify a feature within CAD model 120. Where particular location is identified automatedly by reference to feature or from user voice input as described above, identified location may be displayed to user; a user prompt may permit the user to affirm that the identified location is the correct location, (e.g. with an "okay" button, "yes" button, or similar event handler), to reject identified location (e.g. with a "no" button, "cancel" button, or similar event handler), and/or to change the location by means including without limitation control of a cursor, entry of text in a text entry field, or an additional voice input.

Continuing to refer to FIG. 16, at step 1610, a user voice input comprising a plurality of words and referring to the particular location is automatically received via the computing device. This may be implemented using any methods or means described above for receiving a user voice input. User voice input may include a direct reference to the particular location. User voice input may include language that indirectly references the particular location by naming a feature at the location, an action to be performed by a feature at the location, and the like. System 100 may process either a direct or indirect reference to particular location as described above. Similarly, user voice input may contain language that directly or indirectly references a feature or specific feature as described in further detail below. User voice input may include language referring to a specific component user wishes to place at particular location. User voice input may include language referring to an additional CAD model user wishes to combine with CAD model 120.

Still referring to FIG. 16, at step 1615, the user voice input is automatedly parsed via the computing device. This may be implemented according to any means or method described above for parsing a user voice input.

At step 1620, with continue reference to FIG. 16, a meaning for the parsed user voice input is automatedly determined, the meaning including a reference to the particular location, one or more words associated with one or more program actions, and one or more words associated with one or more command topics, each of the particular location, program actions, and command topics related to a specific feature of the displayed CAD model 120 referred to in the voice input. System 100 may determine the meaning according to any means or methods described above for determining a meaning of a parsed user voice input. For example, and without limitation, the plurality of words may describe a feature at the particular location; determining the meaning may include automatedly identifying the specific feature as the feature at the location. Automatedly identifying the specific feature may be performed by reference to a CAD context database 500 as described above; CAD model analyzer 114 may be used to identify or locate the specific feature within CAD model 120. As another non-limiting example, determining the meaning may include automatedly identifying, using the reference to the particular location, at least a feature at the particular location. At least a feature may be identified using CAD model analyzer 114, for instance as described above for identifying a feature at a location in a CAD model 120. System 100 may automatedly identify specific feature as a function at least a feature. System 100 may choose a single feature of the at least a feature as described above, or may present the user with a set of features from which to choose. User may choose specific feature from the presented set by any means usable for selecting particular location; where a single feature is presented as specific feature by system 100, user may accept or reject single feature by way of event handlers as described above for acceptance, rejection, or modification of particular location.

At step 1625, and still referring to FIG. 16, information including one or more attributes of the specific feature is automatedly identified via the computing device, based on the determined meaning. This may be accomplished using any means and/or methods described above for identifying one or more attributes of a feature. As a nonlimiting example identifying one or more attributes of the specific feature may include determining one or more words, of the user voice input, associated with a component type; component type may be any component type described above in reference to FIG. 9. Further continuing the example, system 100 may identify specific feature as a function of component type; for instance, CAD model analyzer 114 may analyze CAD model 120 to identify features that pass a compatibility check with components of component type. As a non-limiting illustration, where component type includes studs, bolts or other components that are inserted into through-holes, CAD model analyzer 114 may identify at least a through-hole in CAD model 120. Where a plurality of features matching component type is discovered, system 100 may automatedly select specific feature as a function of plurality of features according to any means and/or method for selection of a specific feature, including without limitation as a function of particular location.

Still referring to FIG. 16, as a further non-limiting example, identifying information including one or more attributes of the specific feature may include identifying one or more manufacturing actions to be represented in the CAD model 120 as a function of the determined meaning. For instance, where a user enters a voice input requesting that a structure be "bolted" to a structure represented in CAD model 120, or at particular location, system 100 may identify as specific feature one or more through-holes for insertion of a bolt; CAD context database 500 may include a table or other link matching particular manufacturing actions, verbs describing particular manufacturing actions, or the like to particular component types and/or feature types. As a further non-limiting example, specific feature may be determined as a function of particular location as described above. However specific feature is identified, one or more attributes of specific feature may be determined according to any means and/or methods for determining one or more attributes of a feature as described above in reference to FIG. 9.

Continuing to refer to FIG. 16, at step 1630, at least a component compatible with the specific feature is automatedly identified by the computing device as a function of the one or more attributes of the specific feature and attribute information of the plurality of candidate components. This may be implemented as describe above in reference to FIG. 9.

Still referring to FIG. 16, at step 1635, an indication of the at least a component compatible with the feature of the structure is automatedly displayed via the computing device. This may be implemented according to any means and/or method described above for displaying or providing an item stored on computing device to a user. Displaying may include without limitation visual display or provision of information via audio output means such as speakers or earphones, or any other means for providing information from a computing device to a user.

With continued reference to FIG. 16, method 1600 may be used as part of a correction to an erroneous user addition to CAD model 120, or an addition that is not compatible, for instance as described above in reference to FIGS. 1A-7B. For instance, where user voice input includes a command to combine a specific component with the specific feature, system 100 may determine that the specific component is not compatible with the specific feature. System 100 may determine that specific component is not compatible with specific feature as described above in reference to FIGS. 1A-7B; in some embodiments, CAD model analyzer 114 may perform a compatibility check and determine that specific component is not compatible. As described above, system 100 may output a message to the user indicating that the specific component is not compatible; message output may be performed by visual or audio means; the message may instruct the user to select a different component. System 100 may use specific component as a source of information to select at least a compatible component. For instance, specific component may have one or more component types as described above, which may be linked to specific component in a database or data structure as described above. System 100 may retrieve component type or types of specific component and proceed with steps of method 1600 to find at least a component of the component type or types that is compatible with feature. System 100 may determine one or more attributes of specific component as described above; the system 100 may then use steps of method 1600 to find at least a compatible component that matches or shares one or more attributes of specific component. In other words, an embodiment of method 1600 may include identifying information including one or more attributes of the specific component. An embodiment of method 1600 may include identifying the at least one component compatible with the specific feature as a function of the one or more attributes of the specific feature, the one or more attributes of the specific component, and the attribute information of the plurality of candidate components.

Still referring to FIG. 16, system may display at least a compatible component to user in conjunction with a message indicating that specific component is not compatible. For instance, message may inform user that specific component is not compatible, and offer to substitute at least a compatible component; message may include event handlers, such as buttons, as described above, so that user can agree or disagree with the proposed action.

Continuing to refer to FIG. 16, system 100 may respond to detection that specific component is not compatible with feature by modifying feature, for instance as described above in reference to FIGS. 8-15, and as described materials incorporated herein by reference. System 100 may automatedly modify feature to be compatible with specific component. System 100 may determine that no compatible component exists within some set of parameters; for instance, system 100 may determine that no compatible component matching one or more types of specific component exists. As an example, where specific component is an incompatible bolt, system may determine that no bolt is compatible with a through-hole included in feature. System 100 may determine that no compatible component matches one or more attributes of specific component; for instance, specific component may be made of aluminum, such as an aluminum stud, and system 100 may determine that no component made of aluminum is compatible with feature. System 100 may automatedly modify feature to be compatible with specific component; system 100 may first prompt user, with event handlers that may enable user to permit modification of specific feature, reject modification of specific feature, select an alternative component, and/or modify attributes or type of components for system 100 to select using method steps 1600. Method 1600 may proceed a second time to find compatible components as described herein, if user rejects modification of specific feature.

Still referring to FIG. 16, the above approaches may be combined in various ways; for instance, system 100 may present user with a family or set of components that are incompatible with specific feature, permitting user to select an incompatible component that causes modification of feature in a manner that user desires. Similarly, at least a compatible component may not be perfectly compatible, but may be a set of one or more components matching some attributes of specific feature, ranked by strength of match, for instance as described above in reference to FIGS. 8-15; user may select a component from the ranked set, and system 100 may modify feature as needed to match component. Modification of feature may include, without limitation, modification to match one or more dimensions of selected component, modification to match a dimension plus or minus some tolerance (for instance, a hole may be widened to be some tolerance amount wider than a portion of a component to be inserted therein, or to be very slightly less wide to allow a compression fit, among other possibilities); CAD model analyzer 114 may locate another CAD model in which selected component is joined to a feature in the other CAD model 120, extract the geometries representing the feature, and replace or modify specific feature with extracted geometries.

With continued reference to FIG. 16, method 1600 may likewise be initiated by the addition of a second CAD model to CAD model 120. For instance, system 100 may receive indication of a second CAD model; indication may be received as part of voice input or an additional voice input. Indication may be received by a previous iteration of a method disclosed herein, including without limitation method 1600; in other words, indication may be received by discovering a second CAD model that is at least a component compatible with specific feature, or with a different specific feature used in the previous iteration of method 1600 or a similar method. System 100 may identify one or more attributes of the second CAD model. Identifying the at least a component compatible with the specific feature may include identifying the at least a component compatible with the specific feature as a function of the one or more attributes of the second CAD model. For instance, particular location may include a surface or surface feature against which a structure represented in second CAD model fits; each of structure and specific feature may include one or more through-holes or other features permitting a fastener, such as without limitation a bolt, to fasten structure and specific feature together, and method 1600 may proceed to find at least a component that is compatible with both the one or more features permitting a fastener of the specific feature and the one or more features permitting a fastener of the structure. Method 1600 may iterate multiple times; for instance, in a non-limiting illustration, method 1600 may iterate once to find structure that fits against specific feature, a second time to find a bolt that can join structure to specific feature, and a third time to find a bolt that fits nut and is compatible with structure and specific feature. Each iteration may call for user confirmation, or entire design may be assembled, for instance by incorporating each compatible component in CAD model 120 as set forth in further detail below and user confirmation may subsequently be sought for the fully assembled result or for some stage thereof.

Still referring to FIG. 16, method 1600 may include modifying CAD model 120 to represent the at least a component compatible with the specific feature combined with the specific feature. For instance, any component or components selected as described above may be represented in CAD model 120 as attached to or otherwise coupled with or joined to specific feature; thus, where at least a component is a bolt, CAD model 120 may be modified to represent the bolt inserted into a through-hole at feature. Likewise, once bolt is inserted in through-hole, if method 1600 iterates again to find a nut that fits bolt, CAD model 120 may again be modified to show nut attached to bolt. This may be performed at each iteration where method 1600 is performed iteratively as described above. System 100 may detect similar features and represent at least a component added to each of the set of similar features, with or without user prompting and confirmation, as described above in reference to FIGS. 8-15. System may modify similar features in the same manner as modification to specific feature.

Continuing to refer to FIG. 16, method 1600 may include querying a resource provider service as described above in reference to FIGS. 1A-7B. In other words, method 1600 may include automatedly assembling a query for additional information via computing device. Query for additional information may be based on meaning, identified information, and/or CAD model 120; where CAD model 120 has been modified in a previous iteration of method 1600, query may be based on CAD model 120 as modified. System 100 may automatedly provide the assembled query to a resource provider serves, for instance as described above in reference to FIGS. 1A-7B. System 100 may automatedly receive additional information from resource provider service, for instance as described above in reference to FIGS. 1A-7B.

With continued reference to FIG. 16, additional information may include any number of additional information elements. For instance, artificial intelligence, as disclosed above may locate additional information based on the determined meaning and the additional information may include the information necessary to identify one or more attributes at any stage of any iteration of method. Additional information may include information regarding the specific feature; identifying information including one or more attributes of the specific feature may include identifying information including one or more attributes of the specific feature as a function of the additional information. Identifying the at least a component compatible with the specific feature may include identifying the at least a component compatible with the specific feature as a function of the one or more attributes of the specific feature and the additional information. Additional information may include information regarding the plurality of components; identifying the at least a component compatible with the at least a specific feature may include identifying the at least a component compatible with the specific feature as a function of the one or more attributes of the specific feature and the additional information.

Continuing to refer to FIG. 16, method 1600 may include automatedly determining that missing information is necessary to identify the at least a compatible component, by the computing device; this may be implemented as described above in reference to FIGS. 1A-7B. Where additional information has been obtained by querying a resource provider service as described above, determining information is missing may be performed as a function of additional information, as well as any other element of information usable as described above in reference to FIGS. 1A-7B. Method 1600 may include prompting the user for missing information, and/or receiving missing information from user; this may be implemented as described above in reference to FIGS. 1A-7B. Method 1600 may include automatedly receiving a response from the user to the prompt for missing information via the computing device, for instance as disclosed above in reference to FIGS. 1A-7B. Method 1600 may include identifying the at least a compatible component as a function of the response, for instance as described above in reference to FIGS. 1A-7B. Response may be combined with any other combination of information as described above to identify at least a component compatible with specific feature.

Although the above method 1600 has been described as a method using voice input to retrieve compatible components, each step of method 1600 may be incorporated in a method omitting one or more steps of method 1600, or substituting other steps as described above, including without limitation receiving one or more of the user voice inputs in a non-voice input form, such as free-form text entry which may be similarly parsed, have meaning determined, and otherwise treated similarly to voice input. Likewise, in some embodiments, user may enter the information described above as entered via voice input by other means such as selection from options, use of a wizard, and the like; persons skilled in the art, upon reading the whole of this disclosure, will be aware of various ways in which method steps and functionalities may be modified or combined consistently with the above description; all such modifications and combinations are considered to be within the scope of this disclosure.

It is to be noted that any one or more of the aspects and embodiments described herein may be conveniently implemented using one or more machines (e.g., one or more computing devices that are utilized as a user computing device for an electronic document, one or more server devices, such as a document server) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk (e.g., a conventional floppy disk, a hard drive disk), an optical disk (e.g., a compact disk "CD", such as a readable, writeable, and/or re-writable CD; a digital video disk "DVD", such as a readable, writeable, and/or rewritable DVD), a magneto-optical disk, a read-only memory "ROM" device, a random access memory "RAM" device, a magnetic card, an optical card, a solid-state memory device (e.g., a flash memory), an EPROM, an EEPROM, and any combinations thereof. A machine-readable medium, as used herein, is intended to include a single medium as well as a collection of physically separate media, such as, for example, a collection of compact disks or one or more hard disk drives in combination with a computer memory. As used herein, a machine-readable storage medium does not include a signal.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a personal digital assistant "PDA", a mobile telephone, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 17:
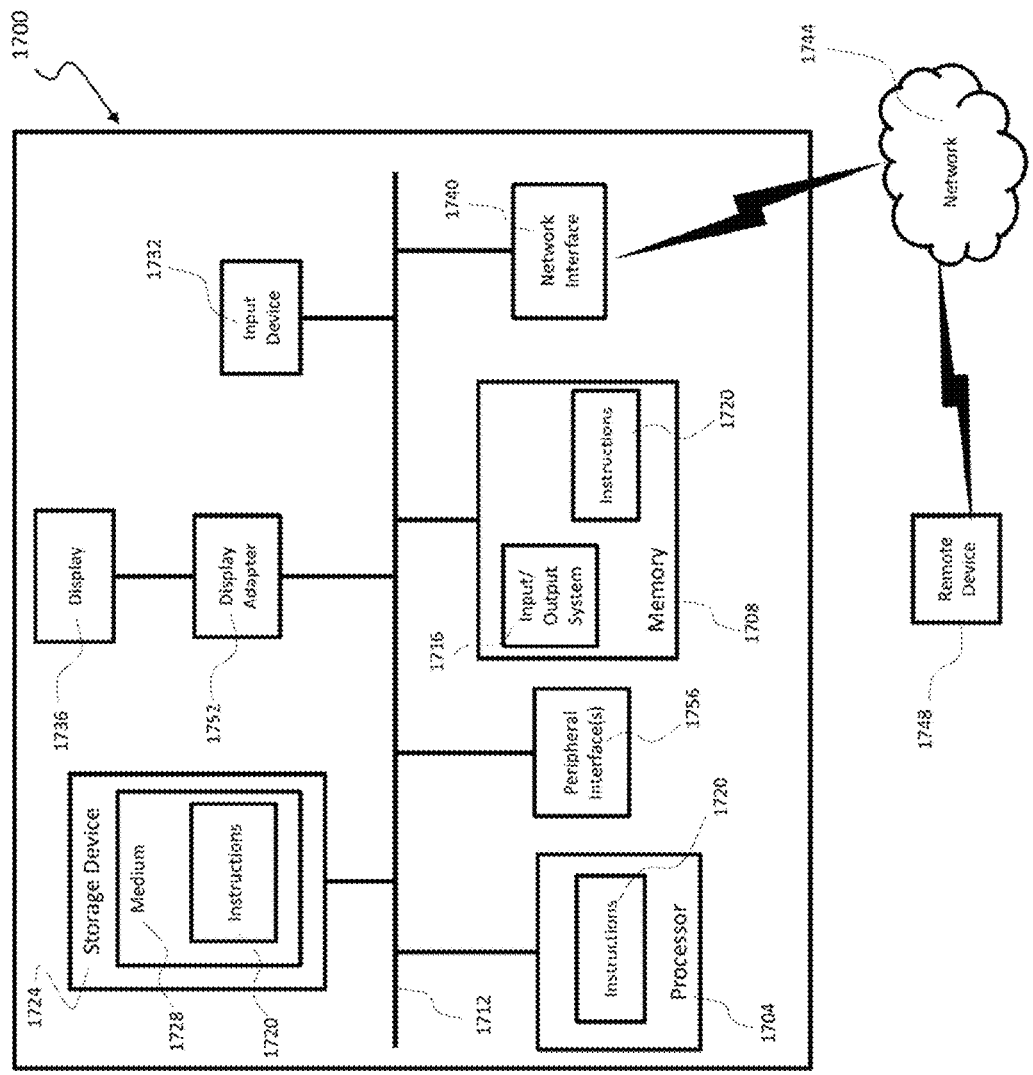
FIG. 17 is a block diagram schematically illustrating exemplary hardware implementations of embodiments of the present invention.

FIG. 17 shows a diagrammatic representation of one embodiment of a computing device in the exemplary form of a computer system or computing module 1700 within which a set of instructions for causing a control system, for example, system 100, sub-system 102 or CAD program module 106, to perform any one or more of the aspects and/or methodologies of the present disclosure may be executed. It is also contemplated that multiple computing devices may be utilized to implement a specially configured set of instructions for causing the device to perform any one or more of the aspects and/or methodologies of the present disclosure. Computer system or module 1700 includes a processor 1704 and a memory 1708 that communicate with each other, and with other components, via a bus 1712. Bus 1712 may include any of several types of bus structures including, but not limited to, a memory bus, a memory controller, a peripheral bus, a local bus, and any combinations thereof, using any of a variety of bus architectures.

Memory 1708 may include various components (e.g., machine readable media) including, but not limited to, a random access memory component (e.g., a static RAM "SRAM", a dynamic RAM "DRAM", etc.), a read only component, and any combinations thereof. In one example, a basic input/output system 1716 (BIOS), including basic routines that help to transfer information between elements within computer system 1700, such as during start-up, may be stored in memory 1708. Memory 1708 may also include (e.g., stored on one or more machine-readable media) instructions (e.g., software) 1720 embodying any one or more of the aspects and/or methodologies of the present disclosure. In another example, memory 1708 may further include any number of program modules including, but not limited to, an operating system, one or more application programs, other program modules, program data, and any combinations thereof.

Computer system 1700 may also include a storage device 1724. Examples of a storage device (e.g., storage device 1724) include, but are not limited to, a hard disk drive for reading from and/or writing to a hard disk, a magnetic disk drive for reading from and/or writing to a removable magnetic disk, an optical disk drive for reading from and/or writing to an optical medium (e.g., a CD, a DVD, etc.), a solid-state memory device, and any combinations thereof. Storage device 1724 may be connected to bus 1712 by an appropriate interface (not shown). Example interfaces include, but are not limited to, SCSI, advanced technology attachment (ATA), serial ATA, universal serial bus (USB), IEEE 1244 (FIREWIRE), and any combinations thereof. In one example, storage device 1724 (or one or more components thereof) may be removably interfaced with computer system 1700 (e.g., via an external port connector (not shown)). Particularly, storage device 1724 and an associated machine-readable medium 1728 may provide nonvolatile and/or volatile storage of machine-readable instructions, data structures, program modules, and/or other data for computer system 1700. In one example, software 1720 may reside, completely or partially, within machine-readable medium 1728. In another example, software 1720 may reside, completely or partially, within processor 1704.

Computer system 1700 may also include an input device 1732. In one example, a user of computer system 1700 may enter commands and/or other information into computer system 1700 via input device 1732. Examples of an input device 1732 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), touchscreen, and any combinations thereof. Input device 1732 may be interfaced to bus 1712 via any of a variety of interfaces (not shown) including, but not limited to, a serial interface, a parallel interface, a game port, a USB interface, a FIREWIRE interface, a direct interface to bus 1712, and any combinations thereof. Input device 1732 may include a touch screen interface that may be a part of or separate from display 1736, discussed further below. Input device 1732 may be utilized as a user selection device for selecting one or more graphical representations in a graphical interface as described above.

A user may also input commands and/or other information to computer system 1700 via storage device 1724 (e.g., a removable disk drive, a flash drive, etc.) and/or network interface device 1740. A network interface device, such as network interface device 1740 may be utilized for connecting computer system 1700 to one or more of a variety of networks, such as network 1744, and one or more remote devices 1748 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 1744, may employ a wired and/or a wireless mode of communication. In general, any network topology may be used. Information (e.g., data, software 1720, etc.) may be communicated to and/or from computer system 1700 via network interface device 1740.

Computer system 1700 may further include a video display adapter 1752 for communicating a displayable image to a display device, such as display device 1736. Examples of a display device include, but are not limited to, a liquid crystal display (LCD), a cathode ray tube (CRT), a plasma display, a light emitting diode (LED) display, and any combinations thereof. Display adapter 1752 and display device 1736 may be utilized in combination with processor 1704 to provide graphical representations of aspects of the present disclosure. In addition to a display device, a computer system 1700 may include one or more other peripheral output devices including, but not limited to, an audio speaker, a printer, and any combinations thereof. Such peripheral output devices may be connected to bus 1712 via a peripheral interface 1756. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. Additionally, although the methods herein have been illustrated as being performed in a specific order, the ordering is highly variable within ordinary skill to achieve the methods, systems, and software for hardware-component based geometric modifications of computer-modeled part designs described herein. Accordingly, this description is meant to be taken only by way of example, and not to otherwise limit the scope of this invention.

What is claimed is:

1. A method of providing a natural language interface for a computer-aided design (CAD) system, the method comprising:

automatedly receiving, via an input device of a computing device, a user selection through a graphical user interface (GUI) of a particular location of a displayed CAD model;

automatedly receiving, via the computing device, a user voice input comprising a plurality of words and referring to the particular location;

automatedly, via the computing device, parsing the user voice input;

automatedly, via the computing device, determining a meaning for the parsed user voice input, the meaning including a reference to the particular location, one or more words associated with one or more program actions, and one or more words associated with one or more command topics, each of the particular location, program actions, and command topics related to a specific feature of the displayed CAD model referred to in the voice input;

automatedly, via the computing device and based on the determined meaning, identifying information including one or more attributes of the specific feature;

automatedly, via the computing device, from among a plurality of candidate components, identifying at least a component compatible with the specific feature as a function of the one or more attributes of the specific feature and attribute information of the plurality of candidate components;

automatedly, via the computing device, displaying an indication of the at least a component compatible with the feature of the structure; and automatedly, via the computing device, updating the GUI with respect to the CAD model based on the indication of the at least a component compatible with the feature of the structure.

2. The method of claim 1, wherein receiving the user selection of the particular location further comprises:
identifying, using the determined meaning, a feature of the displayed CAD model; and
identifying a location at the feature of the displayed CAD model.

3. The method of claim 2 further comprising displaying the identified location to the user.

4. The method of claim 1, wherein identifying information including one or more attributes of the specific feature further comprises:
determining one or more words, of the user voice input, associated with a component type;
identifying the specific feature as a function of the component type; and
identifying the one or more attributes of the specific feature as a function of the specific feature.

5. The method of claim 1, wherein identifying information including one or more attributes of the specific feature further comprises:
identifying, as a function of the determined meaning, one or more manufacturing actions to be represented in the CAD model;
identifying the specific feature as a function of the one or more manufacturing actions; and
identifying the one or more attributes of the specific feature as a function of the specific feature.

6. The method of claim 1, wherein identifying information including one or more attributes of the specific feature further comprises:
identifying specific feature as a function of the particular location; and
identifying the one or more attributes of the specific feature as a function of the specific feature.

7. The method of claim 1, wherein identifying information including one or more attributes of the specific feature further comprises identifying information including one or more attributes of the specific feature via a CAD context database, using the determined meaning.

8. The method of claim 1, wherein the user voice input further comprises a command to combine a specific component with the specific feature, and further comprising determining that the specific component is not compatible with the specific feature.

9. The method of claim 8, wherein displaying the indication of the at least one component compatible with the feature further comprises displaying a message indicating that the specific component is not compatible.

10. The method of claim 8, wherein identifying the at least one component compatible with the feature further comprises:
identifying information including one or more attributes of the specific component; and
identifying the at least one component compatible with the specific feature as a function of the one or more attributes of the specific feature, the one or more attributes of the specific component, and the attribute information of the plurality of candidate components.

11. The method of claim 1 further comprising receiving indication of a second CAD model and identifying one or more attributes of the second CAD model, and wherein identifying the at least a component compatible with the specific feature further comprises identifying the at least a component compatible with the specific feature as a function of the one or more attributes of the second CAD model.

12. The method of claim 1 further comprising:
automatedly, via the computing device, assembling a query for additional information based on the meaning, the identified information, and the CAD model;
automatedly, via the computing device, providing the assembled query to a resource provider service;
automatedly, via the computing device, receiving the additional information from the resource provider service.

13. The method of claim 12, wherein the additional information includes information regarding the specific feature, and wherein identifying information including one or more attributes of the specific feature further comprises identifying information including one or more attributes of the specific feature as a function of the additional information.

14. The method of claim 12, wherein the additional information includes information regarding the specific feature, and wherein identifying the at least a component compatible with the specific feature further comprises identifying the at least a component compatible with the specific feature as a function of the one or more attributes of the specific feature and the additional information.

15. The method of claim 12, wherein the additional information includes information regarding the plurality of components, and wherein identifying the at least a component compatible with the at least a specific feature further comprises identifying the at least a component compatible with the specific feature as a function of the one or more attributes of the specific feature and the additional information.

16. The method of claim 1 further comprising:
automatedly, by the computing device, determining that missing information is necessary to identify the at least a compatible component; and
automatedly, via the computing device, prompting the user for the missing information.

17. The method of claim 16 further comprising:
automatedly, via the computing device, receiving a response from the user to the prompt for missing information; and
identifying the at least a compatible component as a function of the response.

18. The method of claim 1 further comprising modifying the CAD model to represent the at least a component compatible with the specific feature combined with the specific feature.

* * * * *